(12) United States Patent
Mok

(10) Patent No.: US 12,713,937 B2
(45) Date of Patent: Aug. 18, 2026

(54) COMPONENT CARRIER AND METHOD OF MANUFACTURING THE SAME

(71) Applicant: AT&S (Chongqing) Company Limited, Chongqing (CN)

(72) Inventor: Jeesoo Mok, Chongqing (CN)

(73) Assignee: AT&S (Chongqing) Company Limited, Chongqing (CN)

( * ) Notice: Subject to any disclaimer, the term of this patent is extended or adjusted under 35 U.S.C. 154(b) by 217 days.

(21) Appl. No.: 18/476,000

(22) Filed: Sep. 27, 2023

(65) Prior Publication Data

US 2024/0021440 A1 Jan. 18, 2024

Related U.S. Application Data

(63) Continuation-in-part of application No. 17/249,515, filed on Mar. 3, 2021, now Pat. No. 11,810,844.

(30) Foreign Application Priority Data

Mar. 12, 2020 (CN) ........................ 202010170353.1

(51) Int. Cl.
*H10W 70/05* (2026.01)
*H10W 70/685* (2026.01)

(52) U.S. Cl.
CPC ......... *H10W 70/095* (2026.01); *H10W 70/05* (2026.01); *H10W 70/685* (2026.01)

(58) Field of Classification Search
CPC ............. H10W 70/095; H10W 70/635; H10W 70/685; H10W 70/614; H10W 70/05
(Continued)

(56) References Cited

U.S. PATENT DOCUMENTS 6,339,197 B1 1/2002 Fushie et al.
11,503,711 B2 * 11/2022 Chung ................ H05K 1/0231
(Continued)

FOREIGN PATENT DOCUMENTS

CN 101593750 A 12/2009
JP 2017063152 A 3/2017
KR 20160094502 8/2016

OTHER PUBLICATIONS

First Office Action in Application No. 202010170353.1 in China; pp. 1-11; Apr. 14, 2021; China National Intellectual Property Administration; No. 6, Xitucheng Lu, Jimenqiao Haidan District, 100088; Beijing City, China.
(Continued)

*Primary Examiner* — Tremesha W Burns
(74) *Attorney, Agent, or Firm* — Robert A. Blaha; Smith Tempel Blaha LLC

(57) ABSTRACT

A component carrier includes an inorganic layer structure having a first main surface and a second main surface; a first electrically insulating layer structure applied on the first main surface of the inorganic layer structure; a first electrically conductive layer structure applied on the first electrically insulating layer structure; and at least one inner hole extending through the inorganic layer structure and the first electrically insulating layer structure. The at least one inner hole is, along its axis, at least partly covered by a plugging material, being different from the first electrically conductive layer structure, so that the plugging material contacts a lateral side of the inorganic layer structure and a lateral side of the first electrically insulating layer structure.

28 Claims, 13 Drawing Sheets

(58) Field of Classification Search
USPC .......................................................... 361/748
See application file for complete search history.

(56) References Cited

U.S. PATENT DOCUMENTS

| | | | |
|---|---|---|---|
| 2009/0294161 | A1 | 12/2009 | Yoshimura et al. |
| 2011/0147059 | A1 | 6/2011 | Ma et al. |
| 2012/0188734 | A1 | 7/2012 | Mikado et al. |
| 2016/0135289 | A1 | 5/2016 | Cho et al. |
| 2017/0006700 | A1 | 1/2017 | Kim et al. |

OTHER PUBLICATIONS

Translation of Cover of First Office Action in Application No. 202010170353.1 in China; pp. 1-3; Apr. 14, 2021; China National Intellectual Property Administration; No. 6, Xitucheng Lu, Jimenqiao Haidan District, 100088; Beijing City, China.

WRBA, J; Extended European Search Report in Application No. 21 159 296.9; pp. 1-8; Aug. 3, 2021; European Patent Office; 80298, Munich, Germany.

* cited by examiner

COMPONENT CARRIER AND METHOD OF MANUFACTURING THE SAME

CROSS-REFERENCE TO RELATED APPLICATION

The present application is a continuation-in-part of U.S. patent application Ser. No. 17/249,515, filed on Mar. 3, 2021, which claimed the benefit of the filing date of the Chinese Patent Application 202010170353.1, filed Mar. 12, 2020, the disclosures of which are hereby incorporated herein by reference.

TECHNICAL FIELD

Embodiments of the invention relate to a component carrier and a method of manufacturing a component carrier.

TECHNOLOGICAL BACKGROUND

A conventional component carrier comprises an IC substrate in the shape of a laminate. Conventional laminates do sometimes not have a high degree of dimensional stability during the manufacturing processes, they can absorb moisture, and their dimensions can change due to thermal effects.

SUMMARY

There may be a need to provide a component carrier and a method of manufacturing the same, by which dimensional changes and warpage can be reduced or even avoided. This need is achieved by the subject matter of the independent claims.

According to a first embodiment, a component carrier comprises an inorganic layer structure having a first main surface and a second main surface; a first electrically insulating layer structure applied on the first main surface of the inorganic layer structure; a first electrically conductive layer structure applied on or above the first electrically insulating layer structure; and at least one inner hole extending through the inorganic layer structure and at least partly through the first electrically insulating layer structure, wherein the at least one inner hole is, along its axis, at least partly covered by a plugging material, being different from the first electrically conductive layer structure, so that the plugging material contacts a lateral side of the inorganic layer structure and a lateral side of the first electrically insulating layer structure. Such holes can be normal connection holes and/or plated through holes (PTH) in the inorganic layer structure.

According to a second embodiment, a method of manufacturing a component carrier comprises the steps of providing an inorganic layer structure having a first main surface and a second main surface; applying a first electrically insulating layer structure on the first main surface of the inorganic layer structure; applying a first electrically conductive layer structure on or above the first electrically insulating layer structure; and providing at least one inner hole extending through the inorganic layer structure and the first electrically insulating layer structure by laser drilling or mechanical drilling or by wet and/or dry etching, wherein the at least one inner hole is, along its axis, at least partly covered by a plugging material, being different from the first electrically conductive layer structure, so that the plugging material contacts a lateral side of the inorganic layer structure and a lateral side of the first electrically insulating layer structure. Wet etching can include chemical etching, and dry etching can include plasma etching.

OVERVIEW OF EMBODIMENTS

In the context of the present application, the term "inorganic layer structure" may particularly denote a layer structure which comprises inorganic material, such as an inorganic compound. In particular, dielectric material of the inorganic layer structure or even the entire inorganic layer structure may be made exclusively or at least substantially exclusively from inorganic material. In another embodiment, the inorganic layer structure may comprise inorganic dielectric material and additionally another dielectric material. An inorganic compound may be a chemical compound that lacks carbon-hydrogen bonds or a chemical compound that is not an organic compound. In an example, the inorganic layer structure may comprise glass, for example silicon base glass, in particular soda lime glass, and/or boro-silicate glass and/or alumo-silicate glass and/or lithium silicate glass and/or alkaline free glass. In another example, the inorganic layer structure may comprise ceramic material, for example aluminum nitride and/or aluminum oxide and/or silicon nitride and/or boron nitride and/or tungsten comprising ceramic material. Yet, in another example, the inorganic layer structure may comprise semi-conducting material, for example silicon and/or germanium and/or silicon oxide and/or germanium oxide and/or silicon carbide and/or gallium nitride. In a further embodiment, the inorganic layer structure may comprise (elemental) metal and/or metal alloys, for example, copper and/or tin and/or bronze. Yet in another embodiment, the inorganic layer structure may comprise inorganic material, which is not listed in the above-mentioned example, such as: $MoS_2$, $CuGaO_2$, $AgAlO_2$, $LiGaTe_2$, $AgInSe_2$, $CuFeS_2$, BeO.

It turned out that a core of a glass material is suitable to keep the dimensions of the component carrier stable. The glass core significantly exhibits a dimensional stability under thermal loads and has a lower coefficient of thermal expansion than conventional IC substrates, which are made of an FR-4 material, for example. The glass core enables an improved warpage control. The first electrically insulating layer structure and the first electrically conductive layer structure can reduce crack formation inside the hole of the glass core. As a result, a high yield manufacturing of the component carrier can be achieved due to the glass core.

Moreover, a small pitch size of traces and a high alignment accuracy are further advantages that can be achieved by the glass core in packaging substrates. As a result, a higher signal integrity with shorter paths can be achieved, for example by a direct chip-to-chip connection.

In the following, further exemplary embodiments of the present invention will be explained.

According to an embodiment, the plugging material does not contact a lateral side of the first electrically conductive layer structure and/or does not extend up to an upper surface of the first electrically conductive layer structure.

According to an embodiment, at an interface between the inorganic layer structure and the first electrically insulating layer structure, the at least one inner hole extends straight through the inorganic layer structure and the first electrically insulating layer structure.

According to an embodiment, the first electrically conductive layer structure is directly applied on the first electrically insulating layer structure.

According to an embodiment, the at least one inner hole comprises a conically-shaped lower inner hole segment, a conically-shaped upper inner hole segment joined to the lower inner hole segment, each of the upper inner hole segment and lower inner hole segment having relatively larger and smaller hole diameter portions, the relatively smaller hole diameter portions of the upper and lower inner hole segments being joined together.

According to an embodiment, an outer hole is formed in the plugging material, wherein the outer hole comprises a conically-shaped lower outer hole segment, a conically-shaped upper outer hole segment joined to the lower outer hole segment, each of the upper outer hole segment and lower outer hole segment having relatively larger and smaller diameter portions, the relatively smaller diameter portions of the upper and lower outer hole segments being joined together.

According to an embodiment, an electrically conductive material is filled in the outer hole.

According to an embodiment, the at least one inner hole also extends through the first electrically conductive layer structure.

According to an embodiment, the first electrically insulating layer structure forms or is part of a double-layer structure comprising a lower insulating layer structure which is applied on the inorganic layer structure and an upper insulating layer structure which is applied on the lower insulating layer structure and the at least one inner hole, wherein the plugging material is formed by material of the upper insulating layer structure. If the first electrically insulating layer structure forms the double-layer structure, the first electrically conductive layer structure is applied on the first electrically insulating layer structure (and above the lower insulating layer structure), and the at least one inner hole extends through the inorganic layer structure and partly through the first electrically insulating layer structure, i.e. (only) through the lower insulating layer structure, wherein the plugging material (i.e. material of the upper insulating layer structure) contacts the lateral side of the inorganic layer structure and a lateral side of the first electrically insulating layer structure, strictly speaking a lateral side of the lower electrically insulating layer structure. Alternatively, if the first electrically insulating layer structure is part of a double-layer structure, in particular the lower insulating layer structure, the first electrically conductive layer structure is applied above the first electrically insulating layer structure; and the at least one inner hole extends through the inorganic layer structure and through the first electrically insulating layer structure, wherein the at least one inner hole is, along its axis, covered by the plugging material (the material of the upper insulating layer structure) so that the plugging material contacts the lateral side of the inorganic layer structure and a lateral side of the first electrically insulating layer structure, i.e., a lateral side of the lower electrically insulating layer structure.

According to an embodiment, the inorganic layer structure has at least one lateral side connecting the first and second main surfaces, wherein the lateral side is at least partly covered by the first electrically insulating layer structure. Thereby, the inorganic layer structure of the component carrier can easier be handled in manufacturing processes. Furthermore, if the first electrically insulating layer structure and the first electrically conductive layer structure are implemented by a resin coated copper foil (RCC), the lateral side of the inorganic layer structure of the component carrier can also be strengthened by the copper material of the resin coated copper foil.

According to an embodiment, the first electrically insulating layer structure and the first electrically conductive layer structure together are formed by a first resin coated copper foil (RCC). The resin coated copper foil has particular benefits in reducing crack formation in the hole of the inorganic layer structure.

According to an embodiment, the component carrier further comprises a second electrically insulating layer structure applied on the second main surface of the inorganic layer structure; and a second electrically conductive layer structure applied on the second electrically insulating layer structure. The lateral side can at least partly be covered by the second electrically insulating layer structure. Thereby, the inorganic layer structure of the component carrier can even easier be handled in the manufacturing processes.

According to an embodiment, the component carrier further comprises a first further electrically insulating layer structure applied or laminated on the first electrically conductive layer structure and the at least one inner hole, wherein the first further electrically insulating layer structure forms the plugging material. The first further electrically insulating layer structure can provide an encapsulation or protection of the component carrier.

According to an embodiment, the component carrier further comprises a first further electrically conductive layer structure applied on the first further electrically insulating layer structure.

According to an embodiment, the at least one inner hole is, along its axis, partly covered by an electrically insulating plugging material.

The insulating plugging material could be either any insulating resin, such as for instance epoxy, or a magnetic paste, serving as inductive material which could ensure signal integrity. It preferably reduces noise. This is particularly important when inorganic layer structures are used, as the glass might lead to an attenuation of the signal. The magnetic paste can offer functions which would not allow to use normal epoxy resin plugging material. In addition to this, the magnetic paste can serve as an inductive material. In addition to that, it is possible to use the magnetic paste to implement a coiled copper-structure. The plugging material can also be a magnetic paste to implement a coiled copper-structure, an inductive material or an insert.

According to an embodiment, a first inner hole and a second inner hole are provided, wherein the first inner hole is, along its axis, at least partly covered by a first plugging material, and the second inner hole is, along its axis, at least partly covered by a second plugging material, wherein the first and second plugging materials are different from each other.

According to an embodiment, the second plugging material is an epoxy resin material.

According to an embodiment, the component carrier comprises at least one of the following: an outer hole is formed in the plugging material, wherein the outer hole is preferably filled by an electrically conductive material, more preferably by copper; the plugging material defines an outer hole; the plugging material has a planar surface, preferably a ground surface; the plugging material protrudes from the first electrically insulating layer structure (if the component carrier comprises a second electrically insulating layer, the plugging material can also protrude from the second electrically insulating layer); the component carrier comprises registration holes which are filled by the same plugging material or another electrically insulating plugging material or magnetic paste.

According to an embodiment, the component carrier further comprises a support layer or a temporary carrier; a cavity within the inorganic layer structure, the first electrically insulating layer structure and the first electrically conductive layer structure, wherein a bottom of the cavity is defined by the support layer or the temporary carrier; and a component arranged on the bottom within the cavity. Instead of the support layer, a temporary carrier can be connected to the stack. Other than the support layer, the temporary carrier is removed from the stack in a later method step.

According to an embodiment, the inorganic layer structure comprises at least two glass panels which are connected to each other by an intermediate electrically insulating layer structure. Thereby, a thicker component carrier can be provided having a higher mechanical stability.

According to an embodiment, the component carrier has a symmetric layer stackup with respect to the inorganic layer structure, wherein the symmetric layer stackup includes a symmetric arrangement of at least one of the first electrically insulating layer structure, the first electrically conductive layer structure, the at least one inner hole, the first further electrically insulating layer structure and the first further electrically conductive layer structure. In the context of the present application, the term "symmetric layer stackup" allows that (wiring) patterns, for example those of the patterned first and second electrically conductive layer structures, may be different from each other. In the same manner, the symmetric layer stackup allows that (wiring) patterns, for example, those of the first and second further electrically conductive layer structures, may be different from each other.

According to an embodiment of the method, a release layer is applied on the second main surface of the inorganic layer structure or on another surface of the component carrier. The release layer can be used for temporarily fixing a component during the manufacturing method.

According to an embodiment, the method further comprises forming a component hole in the inorganic layer structure, the first electrically insulating layer structure and the first electrically conductive layer structure; connecting a support layer or a temporary carrier to a stack comprising the inorganic layer structure, the first electrically insulating layer structure and the first electrically conductive layer structure so that a cavity is formed, wherein a bottom of the cavity is defined by the support layer or the temporary carrier; and arranging a component on the bottom within the cavity.

According to an embodiment, the method further comprises the following substeps: arranging the inorganic layer structure in an insulating frame; arranging the first resin coated copper foil on the first main surface of the inorganic layer structure and the insulating frame; arranging a second resin coated copper foil on the second main surface of the inorganic layer structure and the insulating frame; laminating the first and second resin coated copper foils to obtain an intermediate stack; and trimming the intermediate stack at its circumference. The insulating frame improves accuracy and handling of the inorganic layer structure during the manufacturing process. The insulating frame could be made of any material which is substantially not deformed under the influence of mechanically applied pressure and/or thermal energy. Preferably, the insulating frame is made of a fully cured resin (e.g., epoxy FR4 or phenolic resins); other possible materials are metals or metalloids, such as iron or aluminum.

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Scale Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imageable or dry-etchable organic material like epoxy-based build-up material (such as epoxy-based build-up film) or polymer compounds like polyimide, polybenzoxazole, or benzocyclobutene-functionalized polymers.

In an embodiment, the at least one electrically insulating layer structure comprises at least one of the group consisting of resin (such as reinforced or non-reinforced resins, for instance epoxy resin or bismaleimide-triazine resin), cyanate ester resin, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (PTFE, Teflon®), a ceramic, and a metal oxide. Teflon® is a registered mark of The Chemours Company FC LLC of Wilmington, Delaware, U.S.A. Reinforcing structures such as webs, fibers or spheres, for example made of glass (multilayer glass) may be used as well. Although prepreg particularly FR4 are usually preferred for rigid PCBs, other materials in particular epoxy-based build-up film or photo-imageable dielectric material may be used as well. For high frequency applications, high-frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In an embodiment, the at least one electrically conductive layer structure comprises at least one of the group consisting of copper, aluminum, nickel, silver, gold, palladium, magnesium and tungsten. Although copper is usually preferred, other materials or coated versions thereof are possible as well, in particular coated with supra-conductive material such as graphene.

The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an optical element (for instance a lens), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such as solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), gold (in particular Hard Gold), chemical tin, nickel-gold, nickel-palladium, ENIPIG (Electroless Nickel Immersion Palladium Immersion Gold), etc.

The aspects defined above and further aspects of the invention are apparent from the examples of embodiment to be described hereinafter and are explained with reference to these examples of embodiment.

DETAILED DESCRIPTION OF ILLUSTRATED EMBODIMENTS

Figure 1:
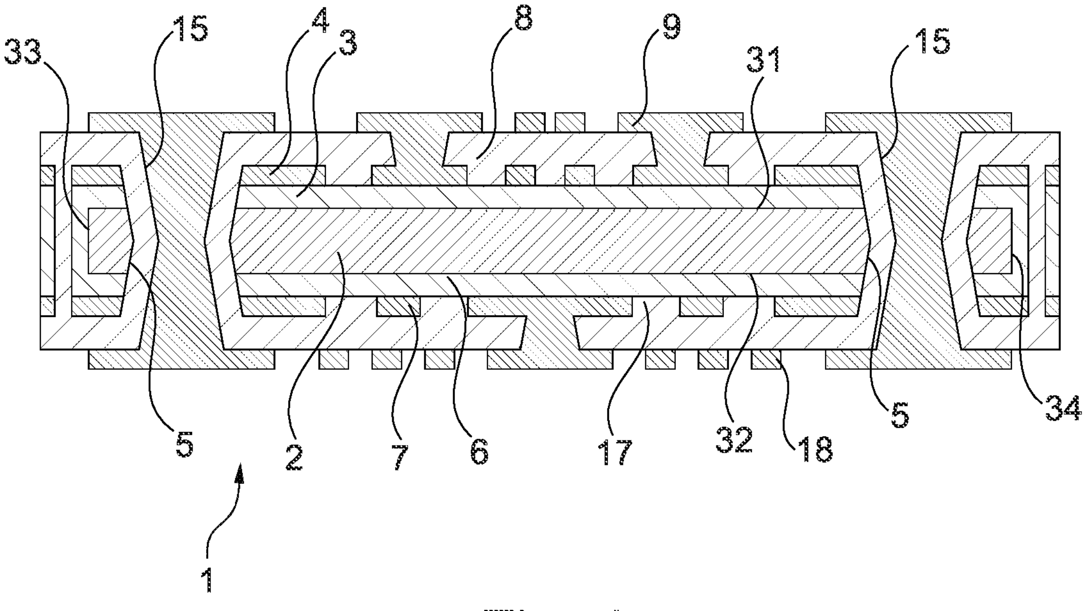
FIG. 1 illustrates a cross-sectional view of a component carrier according to an exemplary embodiment of the disclosure.

The illustrations in the drawings are schematically presented. In different drawings, similar or identical elements are provided with the same reference signs.

FIG. 1 illustrates a cross-sectional view of a component carrier 1 according to an exemplary embodiment of the invention. The component carrier 1 comprises a glass core 2 having a first main surface 31 and a second main surface 32; a first electrically insulating layer structure 3 applied on the first main surface 31 of the glass core 2; and a patterned first electrically conductive layer structure 4 applied on the first electrically insulating layer structure 3. The first electrically insulating layer structure 3 and the first electrically conductive layer structure 4 together can be formed by a first resin coated copper foil (RCC).

Two inner holes 5 extend through the glass core 2, the first electrically insulating layer structure 3, and the first electrically conductive layer structure 4.

The component carrier 1 further comprises a second electrically insulating layer structure 6 applied on the second main surface 32 of the glass core 2; and a patterned second electrically conductive layer structure 7 applied on the second electrically insulating layer structure 6. The second electrically insulating layer structure 6 and the second electrically conductive layer structure 7 together can be formed by a second resin coated copper foil (RCC). The inner holes 5 also extend through the second electrically insulating layer structure 6 and the second electrically conductive layer structure 7.

The glass core 2 has lateral sides 33, 34 connecting the first and second main surfaces 31, 32, where the lateral sides 33, 34 are covered by the first and second electrically insulating layer structures 3, 6.

A first further electrically insulating layer structure 8 is applied or laminated on the first electrically conductive layer structure 4 and the inner holes 5. A second further electrically insulating layer structure 17 is laminated on the second electrically conductive layer structure 7 and the inner holes 5. Outer holes 15 corresponding to the inner holes 5 extend through the first further electrically insulating layer structure 8 and the second further electrically insulating layer structure 17. A patterned first further electrically conductive layer structure 9 is applied on the first further electrically insulating layer structure 8, and a patterned second further electrically conductive layer structure 18 is applied on the second further electrically insulating layer structure 17. The material of the first further electrically insulating layer structure 8 and the second further electrically conductive layer structure 18 also fills the outer holes 15.

Figure 2:
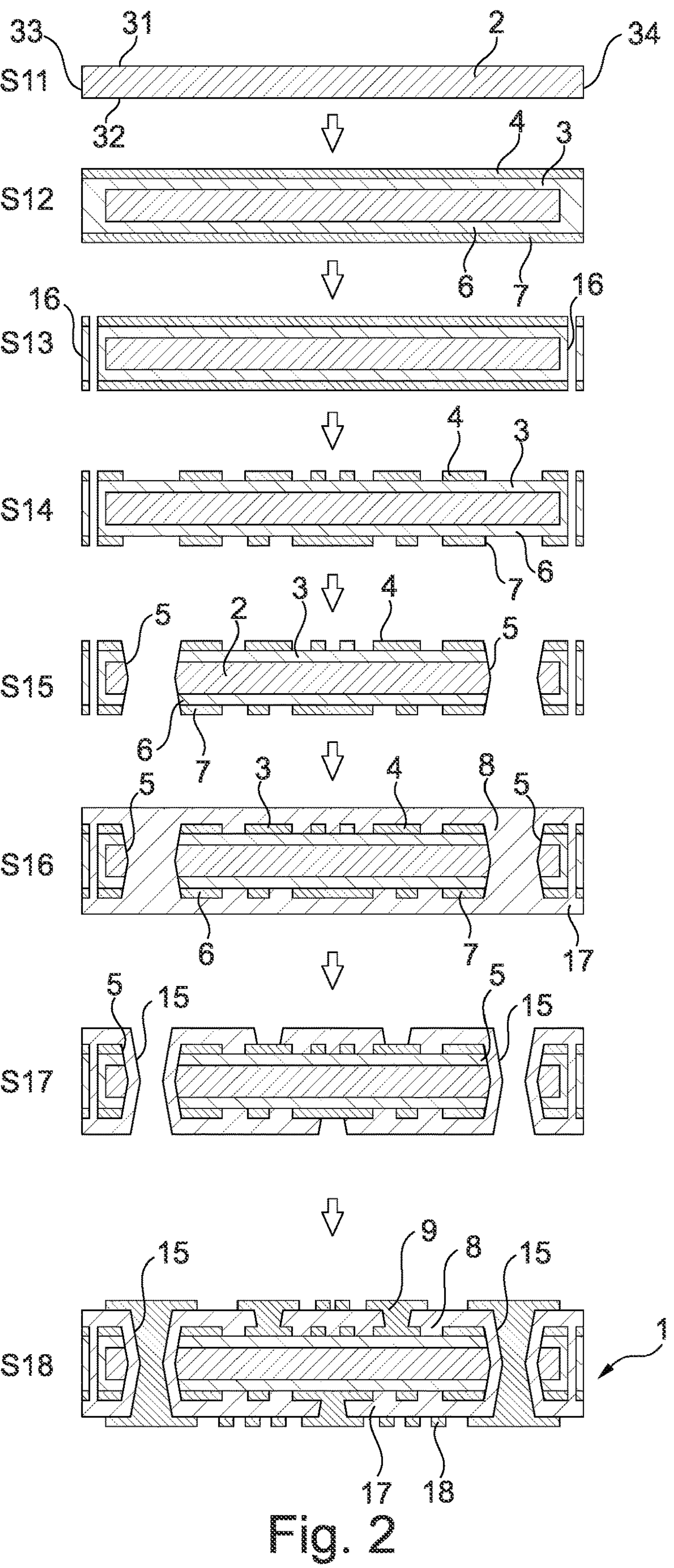
FIG. 2 illustrates a method of manufacturing a component carrier of FIG. 1 according to an exemplary embodiment of the disclosure.

FIG. 2 illustrates a method of manufacturing the component carrier 1 of FIG. 1 according to an exemplary embodiment of the invention.

In a step S11, a glass core 2 having a first main surface 31 and a second main surface 32 is provided. The glass core 2 has lateral sides 33, 34 connecting the first and second main surfaces 31, 32.

In a step S12, a first electrically insulating layer structure 3 is applied on the first main surface 31 of the glass core 2, and a first electrically conductive layer structure 4 is applied on the first electrically insulating layer structure 3. The first electrically insulating layer structure 3 and the first electrically conductive layer structure 4 together can be formed by a first resin coated copper foil (RCC). The first electrically insulating layer structure 3 and the first electrically conductive layer structure 4 can be laminated onto the glass core 2. The lateral sides 33, 34 are at least partly covered by the first electrically insulating layer structure 3.

A second electrically insulating layer structure 6 is applied on the second main surface 32 of the glass core 2, and a second electrically conductive layer structure 7 is applied on the second electrically insulating layer structure 6. The second electrically insulating layer structure 6 and the second electrically conductive layer structure 7 together can be formed by a second resin coated copper foil (RCC). The second electrically insulating layer structure 6 and the second electrically conductive layer structure 7 can be laminated onto the glass core 2. The lateral sides 33, 34 are at least partly covered by the second electrically insulating layer structure 6.

In a modification, a release layer (not shown) can be applied on the second main surface 32 of the glass core 2 instead of the second electrically insulating layer structure 6 and the second electrically conductive layer structure 7. The release layer is usually peeled off in a later method step.

In a step S13, registration holes 16 (or reference holes 16), which extend through the glass core 2, the first and second electrically insulating layer structures 3, 6 and the first and second electrically conductive layer structures 4, 7, are made by mechanical drilling, for example. Alternatively, the registration holes 16 can be made by laser drilling.

In a step S14, the first and second electrically conductive layer structures 4, 7 are patterned, for example by conventional lithography methods combined with wet and/or dry etching methods. Alternatively, the first and second electrically conductive layer structures 4, 7 can also be patterned, for example, by physical vapor deposition (PVD) as for instance sputtering or by chemical vapor deposition (CVD).

In a step S15, at least one inner hole 5, for example two inner holes 5, which extend through the glass core 2, the first and second electrically insulating layer structures 3, 6 and the first and second electrically conductive layer structures 4, 7, are made by laser drilling or mechanical drilling or by wet and/or dry etching, for example.

In a step S16, a first further electrically insulating layer structure 8 is laminated on the first electrically conductive layer structure 4 and the inner holes 5; and a second further electrically insulating layer structure 17 is laminated on the second electrically conductive layer structure 7 and the inner holes 5. Because the first electrically conductive layer structure 4 and the second electrically conductive layer structure 7 have been patterned in step S14, the first further electrically insulating layer structure 8 contacts the first electrically insulating layer structure 3, and the second further electrically insulating layer structure 17 contacts the second electrically insulating layer structure 6. The first further electrically insulating layer structure 8 and the second further electrically insulating layer structure 17 can be an ABF® material (Ajinomoto Build-up Film), respectively. ABF® is a registered mark of Ajinomoto Co. Inc. of Tokyo, Japan.

In a step S17, outer holes 15 are formed through the first further electrically insulating layer structure 8 corresponding to the inner holes 5 and through the second further electrically insulating layer structure 17 corresponding to the inner holes 5, for example by laser drilling or mechanical drilling. Two laser drilling processes can be carried out to form each outer hole 15, i.e., one laser drilling process at the first main surface and another concentric laser drilling process at the second surface.

In a step S18, a first further electrically conductive layer structure 9 is applied on the first further electrically insulating layer structure 8, and a second further electrically conductive layer structure 18 is applied on the second further electrically insulating layer structure 17. The outer holes 15 are filled by the first and second further electrically conductive layer structures 9, 18. The first further electrically conductive layer structure 9 and the second further electrically conductive layer structure 18 are patterned, for example by conventional lithography methods combined with dry and/or wet etching methods. Alternatively, the first further electrically conductive layer structure 9 and the second further electrically conductive layer structure 18 can be patterned, for example, by physical vapor deposition (PVD) as for instance sputtering or by chemical vapor deposition (CVD).

Figure 3:
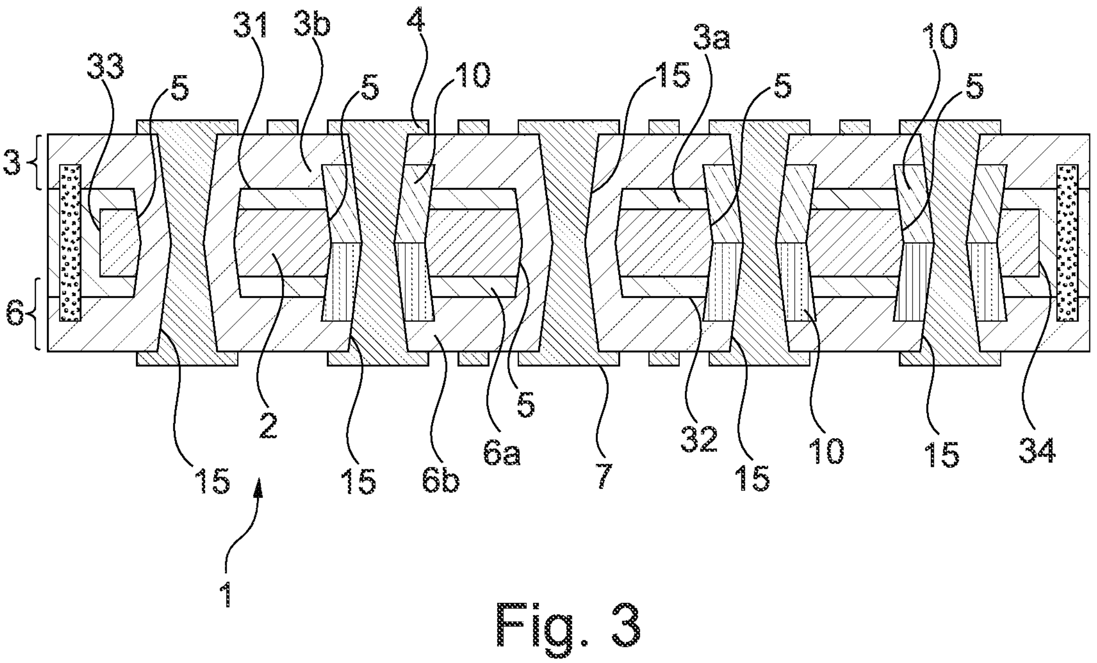
FIG. 3 illustrates a cross-sectional view of a component carrier according to an exemplary embodiment of the disclosure.

FIG. 3 illustrates a cross-sectional view of a component carrier 1 according to an exemplary embodiment of the invention. The component carrier 1 comprises a glass core 2 having a first main surface 31 and a second main surface 32; a first electrically insulating layer structure 3 applied on the first main surface 31 of the glass core 2; and a patterned first electrically conductive layer structure 4 applied on the first electrically insulating layer structure 3.

Five inner holes 5 extend through the glass core 2 and the first electrically insulating layer structure 3.

The first electrically insulating layer structure 3 is a double-layer structure formed by an insulating layer structure 3*a* which is applied on the glass core 2 and an insulating layer structure 3*b* which is applied on the insulating layer structure 3*a* and the inner holes 5.

The component carrier 1 further comprises a second electrically insulating layer structure 6 applied on the second main surface 32 of the glass core 2; and a patterned second electrically conductive layer structure 7 applied on the second electrically insulating layer structure 6. The second electrically insulating layer structure 6 is a double-layer structure formed by an insulating layer structure 6*a* which is applied on the glass core 2 and an insulating layer structure 6*b* which is applied on the insulating layer structure 6*a* and the inner holes 5.

Outer holes 15 corresponding to the inner holes 5 extend through the first and second electrically insulating layer structures 3, 6.

The glass core 2 has lateral sides 33, 34 connecting the first and second main surfaces 31, 32, where the lateral sides 33, 34 are covered by the first and second electrically insulating layer structures 3, 6.

The inner holes 5 are, along their axes, partly covered by an electrically insulating plugging material 10. The insulating plugging material 10 defines the outer holes 15. The insulating plugging material 10 could be either any insulating resin, such as for instance epoxy, or it could be a magnetic paste, serving as inductive material. The magnetic paste can have functions which would not allow to use normal epoxy resin plugging material. In addition to this, the magnetic paste can serve as an inductive material.

Figure 4:
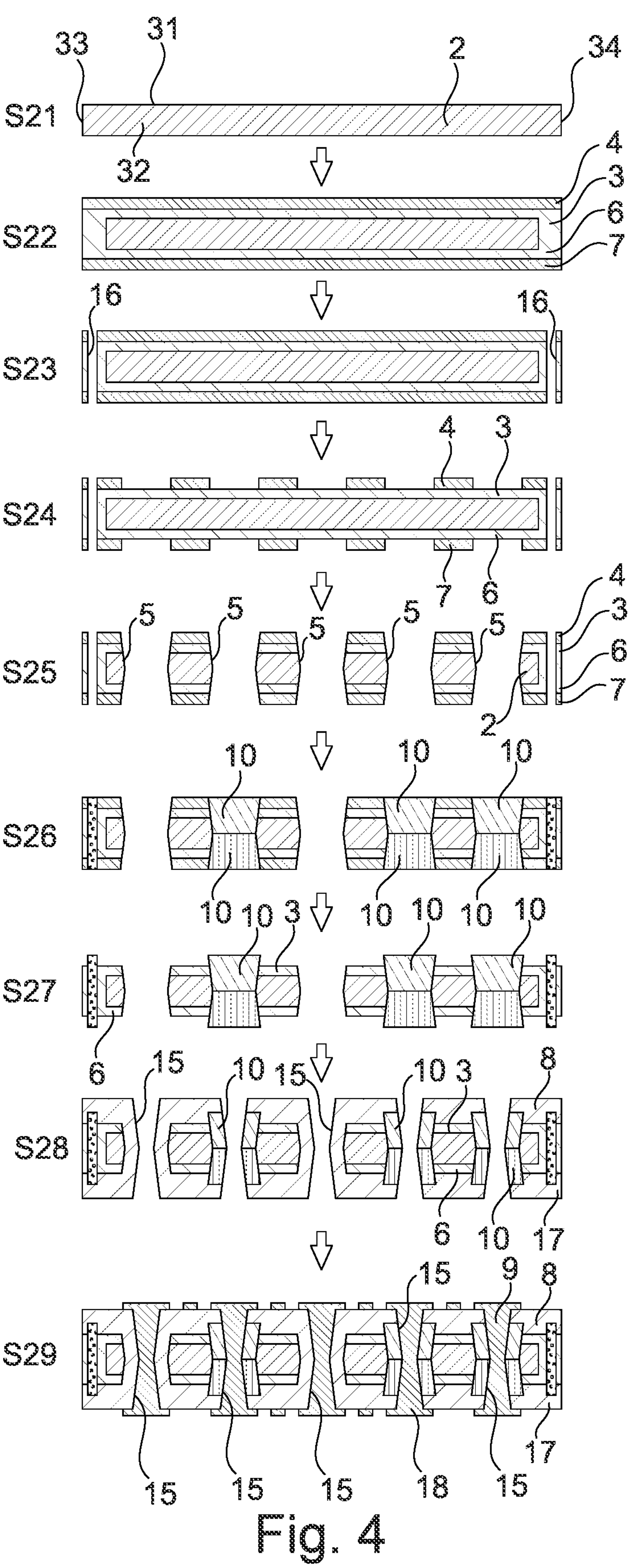
FIG. 4 illustrates a method of manufacturing a component carrier of FIG. 3 according to an exemplary embodiment of the disclosure.

FIG. 4 illustrates a method of manufacturing the component carrier of FIG. 3 according to an exemplary embodiment of the invention.

In a step S21, a glass core 2 having a first main surface 31 and a second main surface 32 is provided. The glass core 2 has lateral sides 33, 34 connecting the first and second main surfaces 31, 32.

In a step S22, a first electrically insulating layer structure 3 is applied on the first main surface 31 of the glass core 2, and a first electrically conductive layer structure 4 is applied on the first electrically insulating layer structure 3. The first electrically insulating layer structure 3 and the first electrically conductive layer structure 4 together can be formed by a first resin coated copper foil. The first electrically insulating layer structure 3 and the first electrically conductive layer structure 4 can be laminated onto the glass core 2. The lateral sides 33, 34 are at least partly covered by the first electrically insulating layer structure 3.

A second electrically insulating layer structure 6 is applied on the second main surface 32 of the glass core 2, and a second electrically conductive layer structure 7 is applied on the second electrically insulating layer structure 6. The second electrically insulating layer structure 6 and the second electrically conductive layer structure 7 together can be formed by a second resin coated copper foil. The second electrically insulating layer structure 6 and the second electrically conductive layer structure 7 can be laminated onto the glass core 2. The lateral sides 33, 34 of the glass core 2 are at least partly covered by the second electrically insulating layer structure 6.

In a modification, a release layer (not shown) can be applied on the second main surface 32 of the glass core 2 instead of the second electrically insulating layer structure 6 and the second electrically conductive layer structure 7. The release layer is usually peeled off in a later method step.

In a step S23, registration holes 16, which extend through the glass core 2, the first and second electrically insulating layer structures 3, 6 and the first and second electrically conductive layer structures 4, 7, are made by mechanical drilling or laser drilling, for example.

In a step S24, the first and second electrically conductive layer structures 4, 7 are patterned, for example by conventional lithography methods combined with dry and/or wet etching methods. Alternatively, the first and second electrically conductive layer structures 4, 7 can be patterned, for example, by physical vapor deposition (PVD) as for instance sputtering or by chemical vapor deposition (CVD).

In a step S25, at least one inner hole 5, for example, five inner holes 5, which extend through the glass core 2, the first and second electrically insulating layer structures 3, 6 and the first and second electrically conductive layer structures 4, 7, are made by laser drilling or mechanical drilling or by wet and/or dry etching, for example.

In a step S26, some of the inner holes 5 are, along their axes, covered by an electrically insulating plugging material 10. Also, the registration holes 16 can be filled by the same or another electrically insulating plugging material/magnetic paste. Optionally, a grinding step can be performed to grind down the surface of the electrically insulating plugging material 10.

The insulating plugging material 10 can be an epoxy resin plugging material. The insulating plugging material 10 can also be a magnetic paste having functions which would not allow a use of normal epoxy resin plugging material. In addition to this, the magnetic paste can serve as an inductive material. In this embodiment, the plugging material 10 can be a magnetic paste, which is not entirely insulating. However, the magnetic paste may have a very low electrical conductivity.

In a step S27, the first and second electrically conductive layer structures 4, 7 are etched-off. It is possible that the electrically insulating plugging material 10 protrudes from the first and second electrically insulating layer structures 3, 6.

In a step S28, a first further electrically insulating layer structure 8 is laminated on the first electrically insulating layer structure 3; and a second further electrically insulating layer structure 17 is laminated on the second electrically insulating layer structure 6. The first further electrically insulating layer structure 8 and the second further electrically insulating layer structure 17 can be an ABF® material (Ajinomoto Build-up Film), respectively. ABF is a registered mark of Ajinomoto Co., Inc. of Tokyo, Japan. Outer holes 15 are formed through the first further electrically insulating layer structure 8 corresponding to the inner holes 5 and through the second further electrically insulating layer structure 17 corresponding to the inner holes 5, for example by laser drilling or mechanical drilling. At this time, the outer holes 15 are also formed through the electrically insulating plugging material 10, by which some of the inner holes 5 are covered.

In a step S29, a first further electrically conductive layer structure 9 is applied on the first further electrically insulating layer structure 8, and a second further electrically conductive layer structure 18 is applied on the second further electrically insulating layer structure 17. The outer holes 15 are filled by the first and second further electrically conductive layer structures 9, 18. The first further electrically conductive layer structure 9 and the second further electrically conductive layer structure 18 are patterned, for example by conventional lithography methods combined with dry and/or wet etching methods. Alternatively, the first further electrically conductive layer structure 9 and the second further electrically conductive layer structure 18 can be patterned, for example, by physical vapor deposition (PVD) as for instance sputtering or by chemical vapor deposition (CVD).

Figure 5:
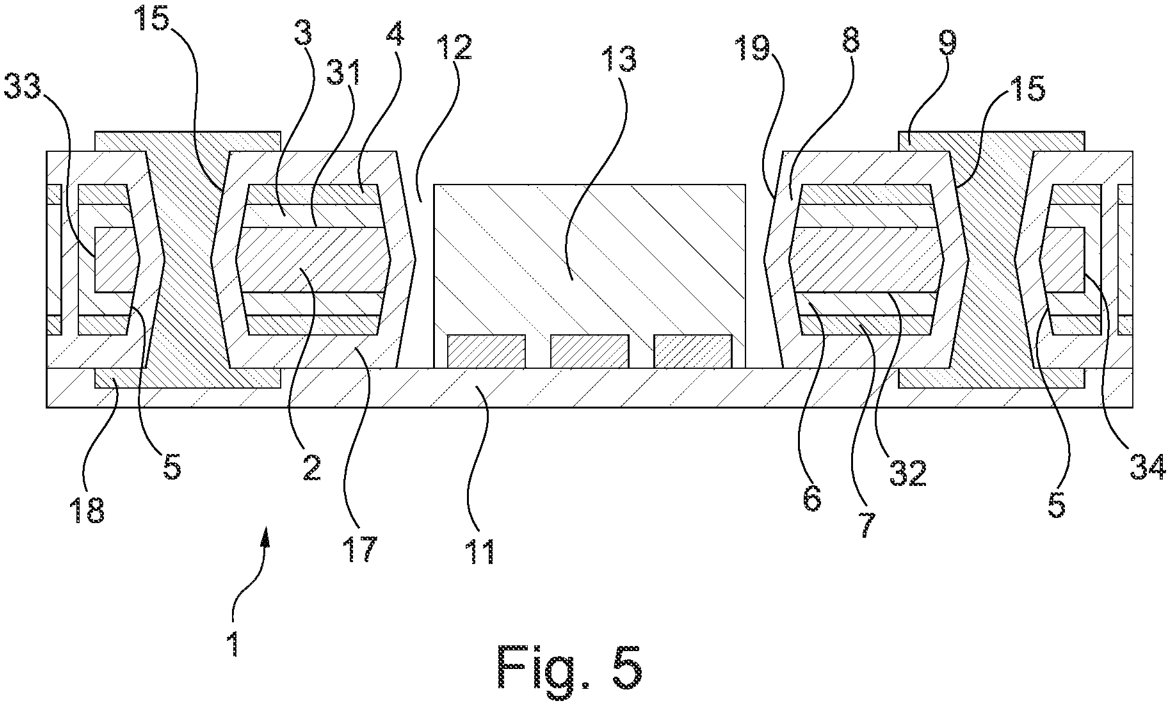
FIG. 5 illustrates a cross-sectional view of a component carrier according to an exemplary embodiment of the disclosure.

FIG. 5 illustrates a cross-sectional view of a component carrier 1 according to an exemplary embodiment of the invention. The component carrier 1 comprises a glass core 2 having a first main surface 31 and a second main surface 32; a first electrically insulating layer structure 3 applied on the first main surface 31 of the glass core 2; and a first electrically conductive layer structure 4 applied on the first electrically insulating layer structure 3. The first electrically insulating layer structure 3 and the first electrically conductive layer structure 4 together can be formed by a first resin coated copper foil.

Two inner holes 5 extend through the glass core 2, the first electrically insulating layer structure 3, and the first electrically conductive layer structure 4.

The component carrier 1 further comprises a second electrically insulating layer structure 6 applied on the second main surface 32 of the glass core 2; and a second electrically conductive layer structure 7 applied on the second electrically insulating layer structure 6. The second electrically insulating layer structure 6 and the second electrically conductive layer structure 7 together can be formed by a second resin coated copper foil. The inner holes 5 also extend through the second electrically insulating layer structure 6 and the second electrically conductive layer structure 7.

The glass core 2 has lateral sides 33, 34 connecting the first and second main surfaces 31, 32, where the lateral sides 33, 34 are covered by the first and second electrically insulating layer structures 3, 6.

A first further electrically insulating layer structure 8 is laminated on the first electrically conductive layer structure 4 and the inner holes 5, and a second further electrically insulating layer structure 17 is laminated on the second electrically conductive layer structure 7 and the inner holes 5. Outer holes 15 corresponding to the inner holes 5 extend through the first further electrically insulating layer structure 8 and the second further electrically insulating layer structure 17. A patterned first further electrically conductive layer structure 9 is applied on the first further electrically insulating layer structure 8, and a patterned second further electrically conductive layer structure 18 is applied on the second further electrically insulating layer structure 17. The material of the first further electrically insulating layer structure 8 and the second further electrically conductive layer structure 18 also fills the outer holes 15.

The component carrier 1 further comprises a support layer 11 and a cavity 12 within the glass core 2, the first and second electrically insulating layer structures 3, 6, the first and second electrically conductive layer structures 4, 7, and the first and second further electrically insulating layer structures 8, 17. A bottom of the cavity 12 is defined by the support layer 11. A circumference of the cavity 12 is defined by a component hole 19. A component 13 is arranged on the bottom within the cavity 12.

The component carrier 1 comprises the glass core 2 as an inorganic layer structure having the first main surface 31 and the second main surface 32; the first electrically insulating layer structure 3 applied on the first main surface 31 of the inorganic layer structure 2; a first electrically conductive layer structure 4 applied on the first electrically insulating layer structure 3 and comprising an upper surface; and inner holes 5 extending through the inorganic layer structure 2 and the first electrically insulating layer structure 3. The inner holes 5 are, along their axis, covered by a plugging material 8, being different from the first electrically conductive layer structure 4, so that the plugging material 8 contacts a lateral side of the inorganic layer structure 2 and a lateral side of the first electrically insulating layer structure 3. The plugging material 8 is formed by the first further electrically insulating layer structure 8.

At an interface between the inorganic layer structure 2 and the first electrically insulating layer structure 3, the inner holes 5 extend straight through the inorganic layer structure 2 and the first electrically insulating layer structure 3.

The first electrically conductive layer structure 4 is directly applied on the first electrically insulating layer structure 3.

The inner holes 5 comprise a conically-shaped lower inner hole segment, a conically-shaped upper inner hole segment joined to the lower inner hole segment, each of the upper inner hole segment and lower inner hole segment having relatively larger and smaller hole diameter portions, the relatively smaller hole diameter portions of the upper and lower inner hole segments being joined together. Thereby, the inner holes 5 have an hourglass-shape.

Outer holes 15 are formed in the plugging material 8, wherein the outer holes 15 comprise a conically-shaped lower outer hole segment, a conically-shaped upper outer hole segment joined to the lower outer hole segment, each of the upper outer hole segment and lower outer hole segment having relatively larger and smaller diameter portions, the relatively smaller diameter portions of the upper and lower outer hole segments being joined together. Thereby, the outer holes 15 have an hourglass-shape. Each pair of inner and outer holes 5, 15 form a double hourglass-shape or an hourglass-in-hourglass-shape.

An electrically conductive material 9 is filled in the outer holes 15, wherein the electrically conductive material 9 is formed by the first further electrically conductive layer structure 9.

The inner holes 5 also extends through the first electrically conductive layer structure 4.

The first electrically insulating layer structure 3 and the first electrically conductive layer structure 4 together can be formed by a first resin coated copper foil.

The component carrier 1 further comprises the second electrically insulating layer structure 6 applied on the second main surface 32 of the inorganic layer structure 2, and the second electrically conductive layer structure 7 applied on the second electrically insulating layer structure 6.

The component carrier further comprises the first further electrically insulating layer structure 17 applied or laminated on the first electrically conductive layer structure 7 and the inner holes 6, wherein the first further electrically insulating layer structure 17 also forms the plugging material.

The first further electrically conductive layer structure 9 is applied on the first further electrically insulating layer structure 8.

The plugging material can be at least one of an electrically insulating plugging material; a magnetic paste; a magnetic paste to implement a coiled copper-structure; an inductive material; or an insert.

A first inner hole 5 and a second inner hole 5 are provided, wherein the first inner hole 5 is, along its axis, covered by the first plugging material 8, and the second inner 5 hole can be, along its axis, covered by a second plugging material, wherein the first and second plugging materials can be different from each other. Preferably, the second plugging material can be an epoxy resin material.

Outer holes 15 are formed in the plugging material 8, wherein the outer holes 15 are filled by an electrically conductive material, preferably by copper. The plugging material 8 defines the outer holes 15. The plugging material 8 has a planar surface, preferably a ground surface. The plugging material 8 protrudes from the first electrically insulating layer structure 3.

The component carrier 1 comprises registration holes which are filled by the same plugging material or another electrically insulating plugging material or magnetic paste.

Figure 6:
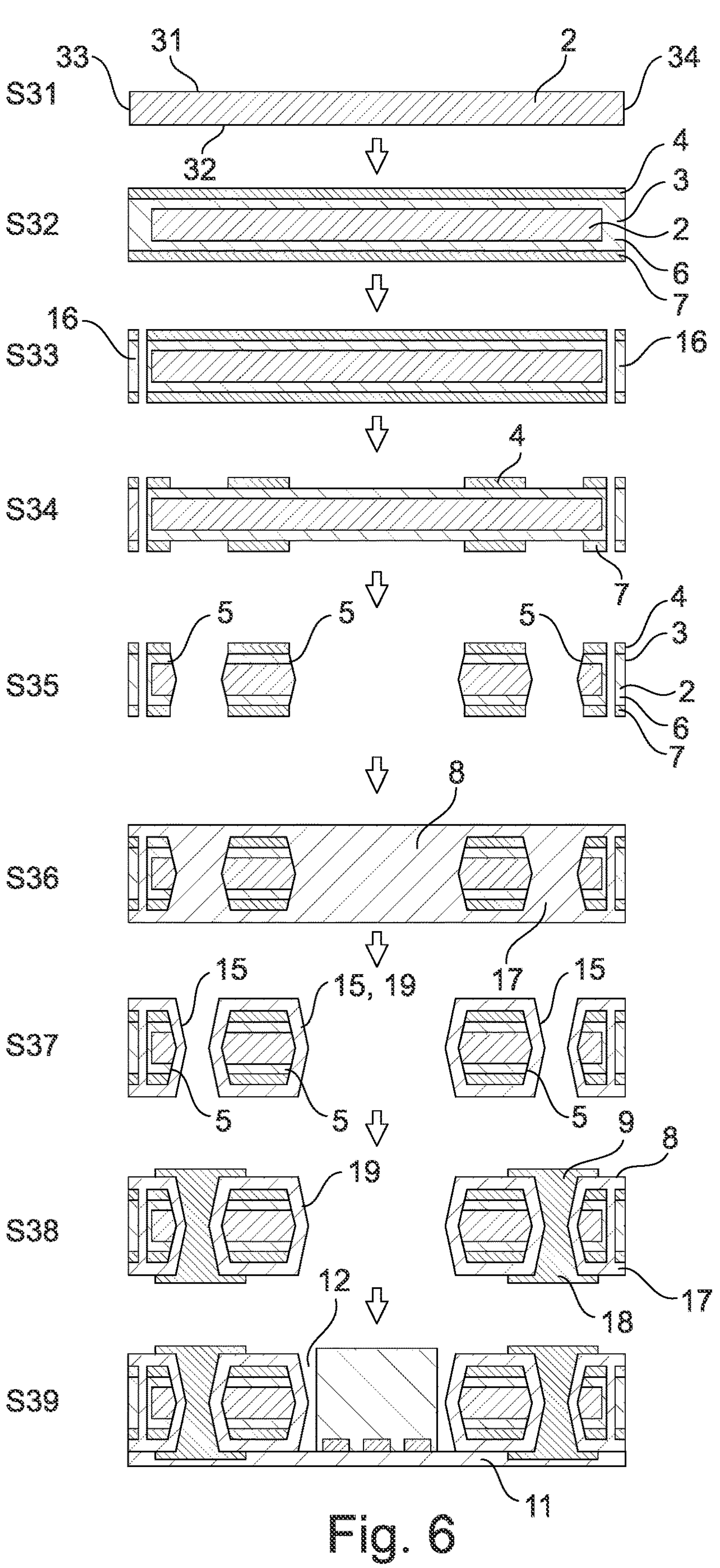
FIG. 6 illustrates a method of manufacturing a component carrier of FIG. 5 according to an exemplary embodiment of the disclosure.

FIG. 6 illustrates a method of manufacturing the component carrier 1 of FIG. 5 according to an exemplary embodiment of the invention.

In a step S31, a glass core 2 having a first main surface 31 and a second main surface 32 is provided. The glass core 2 has lateral sides 33, 34 connecting the first and second main surfaces 31, 32.

In a step S32, a first electrically insulating layer structure 3 is applied on the first main surface 31 of the glass core 2, and a first electrically conductive layer structure 4 is applied on the first electrically insulating layer structure 3. The first electrically insulating layer structure 3 and the first electrically conductive layer structure 4 together can be formed by a first resin coated copper foil. The first electrically insulating layer structure 3 and the first electrically conductive layer structure 4 can be laminated onto the glass core 2. The lateral sides 33, 34 are at least partly covered by the first electrically insulating layer structure 3.

A second electrically insulating layer structure 6 is applied on the second main surface 32 of the glass core 2, and a second electrically conductive layer structure 7 is applied on the second electrically insulating layer structure 6. The second electrically insulating layer structure 6 and the second electrically conductive layer structure 7 together can be formed by a second resin coated copper foil. The second electrically insulating layer structure 6 and the second electrically conductive layer structure 7 can be laminated onto the glass core 2. The lateral sides 33, 34 are at least partly covered by the second electrically insulating layer structure 6.

In a modification, a release layer (not shown) can be applied on the second main surface 32 of the glass core 2 instead of the second electrically insulating layer structure 6 and the second electrically conductive layer structure 7. The release layer is usually peeled off in a later method step.

In a step S33, registration holes 16, which extend through the glass core 2, the first and second electrically insulating layer structures 3, 6 and the first and second electrically conductive layer structures 4, 7, are made by mechanical drilling or laser drilling, for example.

In a step S34, the first and second electrically conductive layer structures 4, 7 are patterned, for example by conventional lithography methods combined with dry and/or wet etching methods. The patterning can be performed by use of a conformal mask, that means before a formation of inner holes 5 for example by laser drilling or mechanical drilling. Alternatively, the first and second electrically conductive layer structures 4, 7 can be patterned, for example, by physical vapor deposition (PVD) as for instance sputtering or by chemical vapor deposition (CVD). In the next step S35, openings are formed in the first and second electrically conductive layer structures 4, 7 for example by lithography (photolithography) methods combined with dry and/or wet etching methods. After this, laser drilling or mechanical drilling of the first and second electrically conductive layer structures 4, 7 can be carried out through these openings in the later step S35.

In the step S35, at least one inner hole 5, for example three inner holes 5, which extend through the glass core 2, the first and second electrically insulating layer structures 3, 6 and the first and second electrically conductive layer structures 4, 7, are made by laser drilling or mechanical drilling or also by wet and/or dry etching, for example.

In a step S36, a first further electrically insulating layer structure 8 is laminated on the first electrically conductive layer structure 4 and the inner holes 5; and a second further electrically insulating layer structure 17 is laminated on the second electrically conductive layer structure 7 and the inner holes 5. The first further electrically insulating layer structure 8 and the second further electrically insulating layer structure 17 can be an ABF® material (Ajinomoto Build-up Film), respectively.

In a step S37, outer holes 15 are formed through the first further electrically insulating layer structure 8 corresponding to the inner holes 5 and through the second further electrically insulating layer structure 17 corresponding to the inner holes 5, for example by laser drilling or mechanical drilling. A central and larger outer hole 15 can also be referred as a component hole 19.

In a step S38, a patterned first further electrically conductive layer structure 9 is applied on the first further electrically insulating layer structure 8, and a patterned second further electrically conductive layer structure 18 is applied on the second further electrically insulating layer structure 17. The material of the first further electrically insulating layer structure 8 and the second further electrically conductive layer structure 18 also fills some of the outer holes 15, but not the central component hole 19. Instead, the component hole 19 is left open.

In a step S39, a support layer 11 is connected to a stack comprising the glass core 2, the first and second electrically insulating layer structures 3, 6, the first and second electrically conductive layer structures 4, 7, the first and second further electrically insulating layer structures 8, 17 and the first and second further electrically conductive layer structures 9, 18 so that a cavity 12 is formed, wherein a bottom of the cavity 12 is defined by the support layer 11 and a circumference of the cavity 12 is defined by the component hole 19. A component 13 is arranged on the bottom within the cavity 12.

In a modification, instead of the support layer 11, a temporary carrier (not shown) can be connected to the stack. Other than the support layer 11, the temporary carrier is removed from the stack in a later method step.

Figure 7:
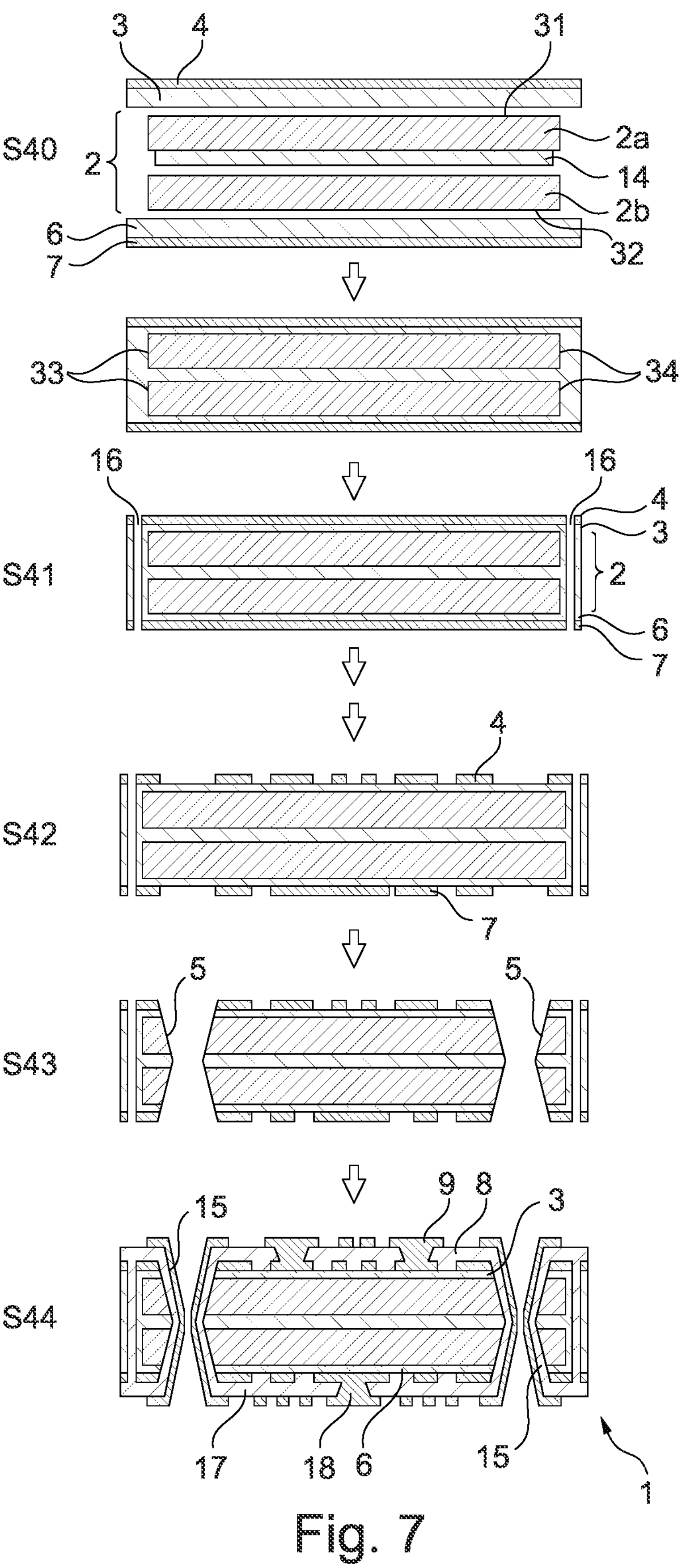
FIG. 7 illustrates a method of manufacturing a component carrier according to an exemplary embodiment of the disclosure.

FIG. 7 illustrates a method of manufacturing a component carrier 1 according to an exemplary embodiment of the invention. The component carrier of FIG. 7 differs from the component carrier of FIG. 1 in that the glass core 2 is formed by at least two glass panels 2*a*, 2*b* which are connected to each other by an intermediate electrically insulating layer structure 14 which is, for example, a laminated prepreg layer.

In a step S40, a glass core 2 having a first main surface 31 and a second main surface 32 is provided. The glass core 2 comprises two glass panels 2*a*, 2*b* which are connected to each other by the intermediate electrically insulating layer structure 14 therebetween, which is, for example a prepreg layer. A first electrically insulating layer structure 3 is applied on the first main surface 31 of the glass core 2, and a first electrically conductive layer structure 4 is applied on the first electrically insulating layer structure 3. The first electrically insulating layer structure 3 and the first electrically conductive layer structure 4 together can be formed by a first resin coated copper foil. A second electrically insulating layer structure 6 is applied on the second main surface 32 of the glass core 2, and a second electrically conductive layer structure 7 is applied on the second electrically insulating layer structure 6. The second electrically insulating layer structure 6 and the second electrically conductive layer structure 7 together can be formed by a second resin coated copper foil. For example, the two glass panels 2*a*, 2*b*, the intermediate electrically insulating layer structure 14 therebetween, and the first and second resin coated copper foils can be laid one upon the other, and a lamination process of these layers is carried out at the same time. The glass core 2 has lateral sides 33, 34 connecting the first and second main surfaces 31, 32, wherein the lateral sides 33, 34 are covered by the first and second electrically insulating layer structures 3, 7.

In a modification, a release layer (not shown) can be applied on the second main surface 32 of the glass core 2 instead of the second electrically insulating layer structure 6 and the second electrically conductive layer structure 7. The release layer can be peeled off in a later method step.

In a step S41, registration holes 16, which extend through the glass core 2, the first and second electrically insulating layer structures 3, 6 and the first and second electrically conductive layer structures 4, 7, are made by mechanical drilling or laser drilling, for example.

In a step S42, the first and second electrically conductive layer structures 4, 7 are patterned, for example by conventional lithography methods combined with dry and/or wet etching methods. Alternatively, the first and second electrically conductive layer structures 4, 7 can be patterned, for example, by physical vapor deposition (PVD) as for instance sputtering or by chemical vapor deposition (CVD).

In a step S43, at least one inner hole 5, for example two inner holes 5, which extend through the glass core 2, the first and second electrically insulating layer structures 3, 6 and the first and second electrically conductive layer structures 4, 7, are made by laser drilling or mechanical drilling or by wet and/or dry etching, for example.

In a step S44, a first further electrically insulating layer structure 8 is laminated on the first electrically conductive layer structure 4 and the inner holes 5; and a second further electrically insulating layer structure 17 is laminated on the second electrically conductive layer structure 7 and the inner holes 5. Because the first electrically conductive layer structure 4 and the second electrically conductive layer structure 7 have been patterned in step S42, the first further electrically insulating layer structure 8 contacts the first electrically insulating layer structure 3, and the second further electrically insulating layer structure 17 contacts the second electrically insulating layer structure 6. The first further electrically insulating layer structure 8 and the second further electrically insulating layer structure 17 can be an ABF® material (Ajinomoto Build-up Film), respectively.

Outer holes 15 are formed through the first further electrically insulating layer structure 8 corresponding to the inner holes 5 and through the second further electrically insulating layer structure 17 corresponding to the inner holes 5, for example by laser drilling or mechanical drilling.

A first further electrically conductive layer structure 9 is applied on the first further electrically insulating layer structure 8, and a second further electrically conductive layer structure 18 is applied on the second further electrically insulating layer structure 17. The outer holes 15 are at least partly filled or plated by the first and second further electrically conductive layer structures 9, 18. The first further electrically conductive layer structure 9 and the second further electrically conductive layer structure 18 are patterned, for example by conventional lithography methods combined with dry and/or wet etching methods. Alternatively, the first further electrically conductive layer structure 9 and the second further electrically conductive layer structure 18 can be patterned, for example, by physical vapor deposition (PVD) as for instance sputtering or by chemical vapor deposition (CVD).

Figure 8:
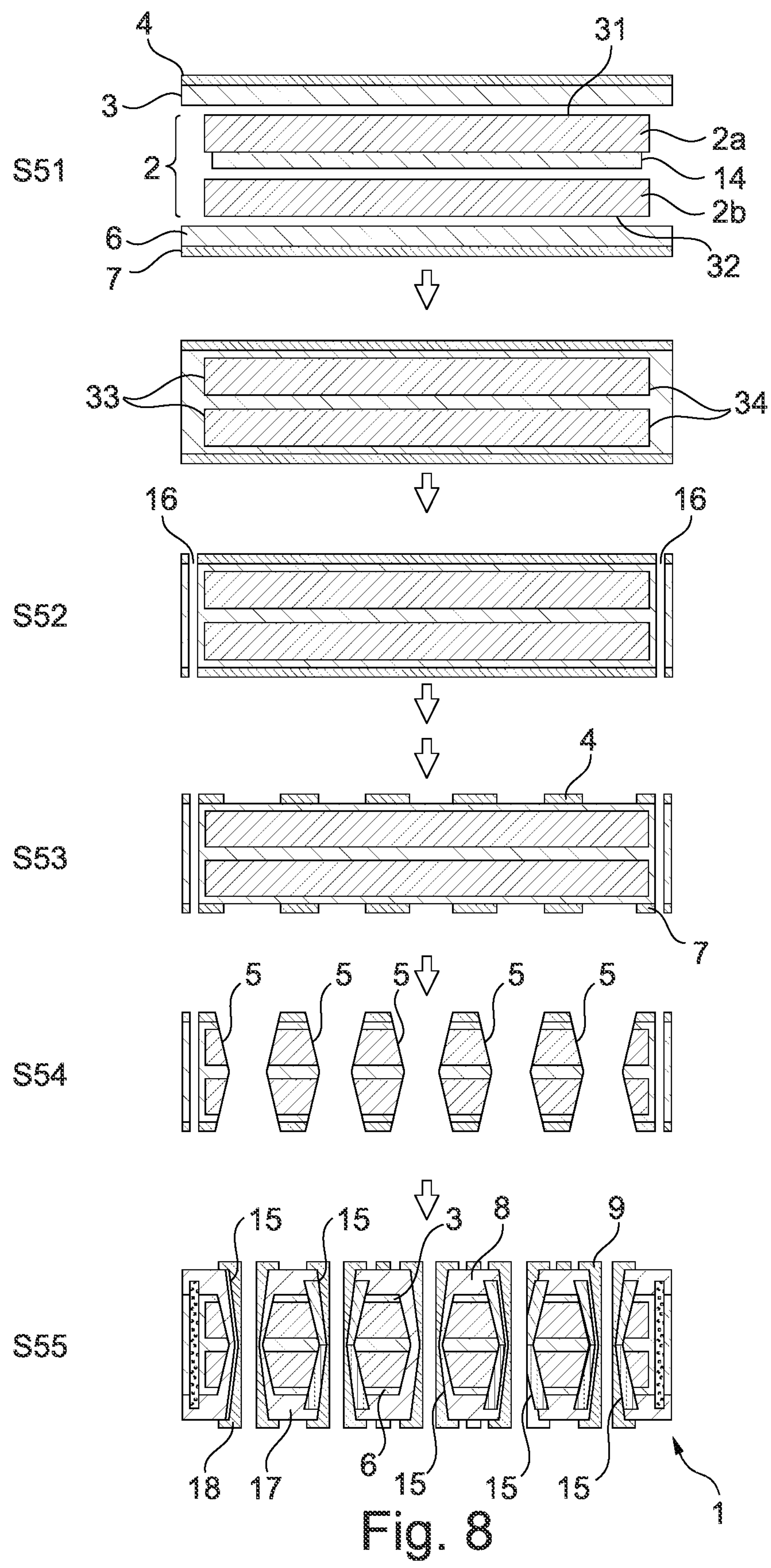
FIG. 8 illustrates a method of manufacturing a component carrier according to an exemplary embodiment of the disclosure.

FIG. 8 illustrates a method of manufacturing a component carrier 1 according to an exemplary embodiment of the invention. The component carrier of FIG. 8 differs from the component carrier of FIG. 3 in that the glass core 2 is formed by at least two glass panels 2*a*, 2*b* which are connected to each other by an intermediate electrically insulating layer structure 14 which is, for example, a laminated prepreg layer.

In a step S51, a glass core 2 having a first main surface 31 and a second main surface 32 is provided. The glass core 2 comprises two glass panels 2*a*, 2*b* which are connected to each other by the intermediate electrically insulating layer structure 14 therebetween, which is, for example a prepreg layer.

A first electrically insulating layer structure 3 is applied on the first main surface 31 of the glass core 2, and a first electrically conductive layer structure 4 is applied on the first electrically insulating layer structure 3. The first electrically insulating layer structure 3 and the first electrically conductive layer structure 4 together can be formed by a first resin coated copper foil. A second electrically insulating layer structure 6 is applied on the second main surface 32 of the glass core 2, and a second electrically conductive layer structure 7 is applied on the second electrically insulating layer structure 6. The second electrically insulating layer structure 6 and the second electrically conductive layer structure 7 together can be formed by a second resin coated copper foil. For example, the two glass panels 2*a*, 2*b*, the intermediate electrically insulating layer structure 14 therebetween, and the first and second resin coated copper foils are laid one upon the other, and a lamination process of these layers is carried out at the same time. The glass core 2 has lateral sides 33, 34 connecting the first and second main surfaces 31, 32, wherein the lateral sides 33, 34 are covered by the first and second electrically insulating layer structures 3, 7.

In a modification, a release layer (not shown) can be applied on the second main surface 32 of the glass core 2 instead of the second electrically insulating layer structure 6 and the second electrically conductive layer structure 7. The release layer can be peeled off in a later method step.

In a step S52, registration holes 16, which extend through the glass core 2, the first and second electrically insulating layer structures 3, 6 and the first and second electrically conductive layer structures 4, 7, are made by mechanical drilling or laser drilling, for example.

In a step S53, the first and second electrically conductive layer structures 4, 7 are patterned, for example by conventional lithography methods combined with dry and/or wet etching methods. The patterning can be performed by use of a conformal mask, that means before the formation of inner holes, for example by laser drilling or mechanical drilling in the next step S54, openings are formed in the first and second electrically conductive layer structures 4, 7 for example by lithography (photolithography) methods combined with dry and/or wet etching methods. After this, laser drilling or mechanical drilling of the first and second electrically conductive layer structures 4, 7 can be carried out through these openings in the later step S54.

In the step S54, at least one inner hole 5, for example five inner holes 5, which extend through the glass core 2, the first and second electrically insulating layer structures 3, 6 and the first and second electrically conductive layer structures 4, 7, are made by laser drilling or mechanical drilling or by wet and/or dry etching, for example.

In a step S55, some of the inner holes 5 are, along their axes, at least partly covered by an electrically insulating plugging material or magnetic paste 10. Also, the registration holes 16 are filled by the same or another electrically insulating plugging material or magnetic paste. Alternatively, at least one of the inner holes 5 can completely be filled with the magnetic paste 10.

The first and second electrically conductive layer structures 4, 7 are etched-off. Optionally, the electrically insulating plugging material or magnetic paste 10 can be ground-off.

A first further electrically insulating layer structure 8 is laminated on the first electrically insulating layer structure 3; and a second further electrically insulating layer structure 17 is laminated on the second electrically insulating layer structure 6. The first further electrically insulating layer structure 8 and the second further electrically insulating layer structure 17 can be an ABF® material (Ajinomoto Build-up Film), respectively. Outer holes 15 are formed through the first further electrically insulating layer structure 8 corresponding to the inner holes 5 and through the second further electrically insulating layer structure 17 corresponding to the inner holes 5, for example, by laser drilling or mechanical drilling. At this time, the outer holes 15 are also formed through the electrically insulating plugging material or magnetic paste 10, by which some of the inner holes 5 are at least partly covered.

A first further electrically conductive layer structure 9 is applied on the first further electrically insulating layer structure 8, and a second further electrically conductive layer structure 18 is applied on the second further electrically insulating layer structure 17. The outer holes 15 are at least partly filled or plated by the first and second further electrically conductive layer structures 9, 18. The first further electrically conductive layer structure 9 and the second further electrically conductive layer structure 18 are patterned, for example by conventional lithography methods combined with dry and/or etching methods.

Alternatively, the first further electrically conductive layer structure 9 and the second further electrically conductive layer structure 18 can also be patterned, for example, by physical vapor deposition (PVD) as for instance sputtering or by chemical vapor deposition (CVD).

Figure 9A:
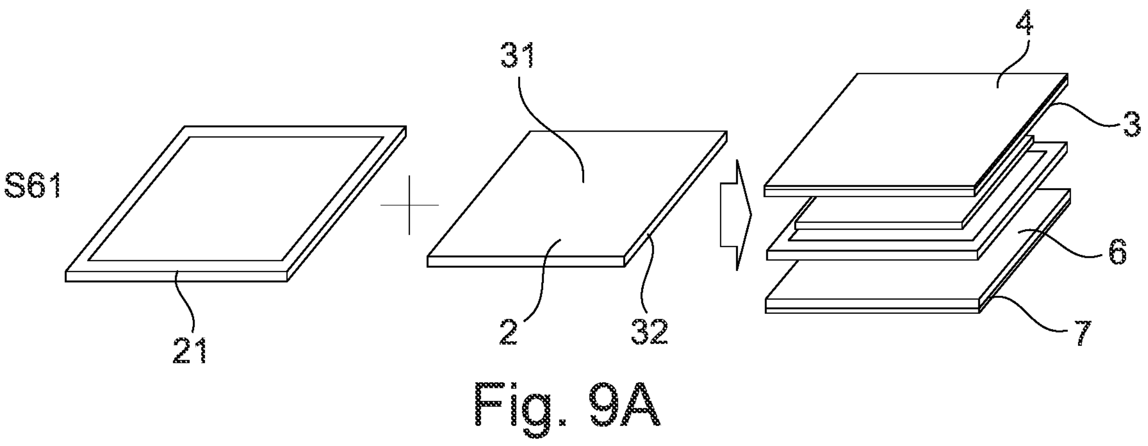
FIG. 9A, FIG. 9B and FIG. 9C illustrate a method of manufacturing a component carrier according to an exemplary embodiment of the disclosure.
Figure 9B:
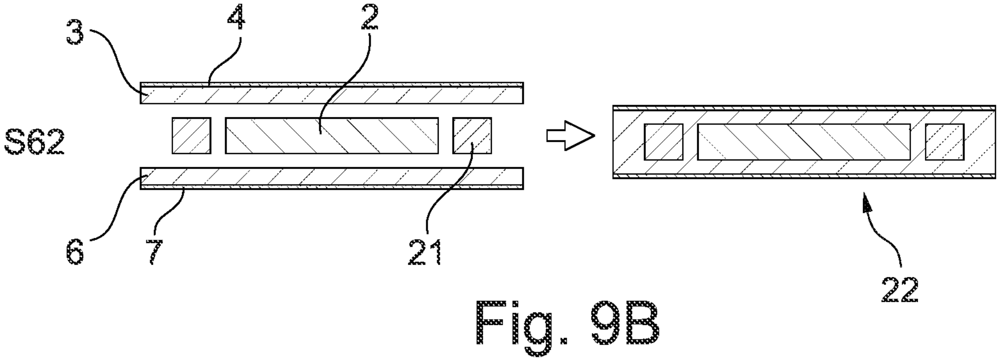
Figure 9C:
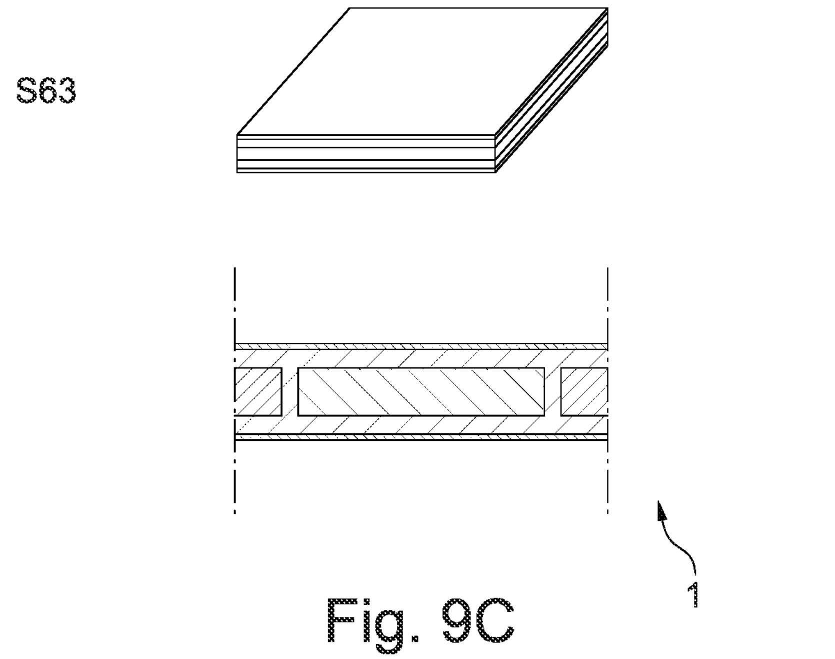

FIGS. 9A to 9C illustrate a method of manufacturing a component carrier 1 according to an exemplary embodiment of the invention.

In a step S61, a glass core 2 is arranged into an electrically insulating frame 21 which is, for example, a frame made of an FR-4 material or another prepreg material provided with a cavity. The electrically insulating frame 21 could be any material which is substantially not deformed under the influence of mechanically applied pressure and/or thermal energy. A first resin coated copper foil 3, 4 is laid on the first main surface 31 of the glass core 2 and the insulating frame 21, and a second resin coated copper foil 6, 7 is laid on the second main surface 32 of the glass core 2 and the insulating frame 21.

In a step S62, the first and second resin coated copper foils 3, 4; 6, 7 are laminated by pressure and/or heat on the glass core 2 and the frame 21 to obtain an intermediate stack 22.

In a step S63, the intermediate stack 22 is trimmed at its circumference to obtain the desired dimensions.

In all of the above-described embodiments, the component carrier 1 is formed to have a symmetric layer stackup with respect to the glass core 2, i.e., the component carrier 1 is mirrored with respect to the glass core 2, wherein the symmetric layer stackup includes a symmetric provision of at least one of the first electrically insulating layer structure 3, the first electrically conductive layer structure 4, the at least one inner hole 5, the corresponding outer holes 15, the first further electrically insulating layer structure 8 and the first further electrically conductive layer structure 9. The symmetric layer stackup allows that patterns, for example those of the patterned first and second electrically conductive layer structures 4, 7, may be different from each other. In the same manner, the symmetric layer stackup allows that patterns, for example those of the first and second further electrically conductive layer structures 9, 18, may be different from each other.

In modified embodiments, the component carriers 1 can be formed to have an asymmetric layer stackup with respect to the glass core 2.

In all of the above-described embodiments, the component carrier 1 can comprise at least one of the following features: the component carrier 1 comprises at least one component 13 being surface mounted on and/or embedded in the component carrier, wherein the at least one component is in particular selected from a group consisting of an electronic component, an electrically non-conductive and/or electrically conductive inlay, a heat transfer unit, a light guiding element, an optical element, a bridge, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip; wherein at least one of the electrically conductive layer structures of the component carrier comprises at least one of the group consisting of copper, aluminum, nickel, silver, gold, palladium, and tungsten, any of the mentioned materials being optionally coated with supra-conductive material such as graphene; wherein at least one of the electrically insulating layer structure comprises at least one of the group consisting of resin, in particular reinforced or non-reinforced resin, for instance epoxy resin or bismaleimide-triazine resin, FR-4, FR-5, cyanate ester resin, polyphenylene derivate, glass, prepreg material, polyimide, polyamide, liquid crystal polymer, epoxy-based build-up film, polytetrafluoroethylene, a ceramic, and a metal oxide; wherein the component carrier is shaped as a plate; wherein the component carrier is configured as one of the group consisting of a printed circuit board, a substrate, and an interposer; wherein the component carrier is configured as a laminate-type component carrier.

Figure 10A:
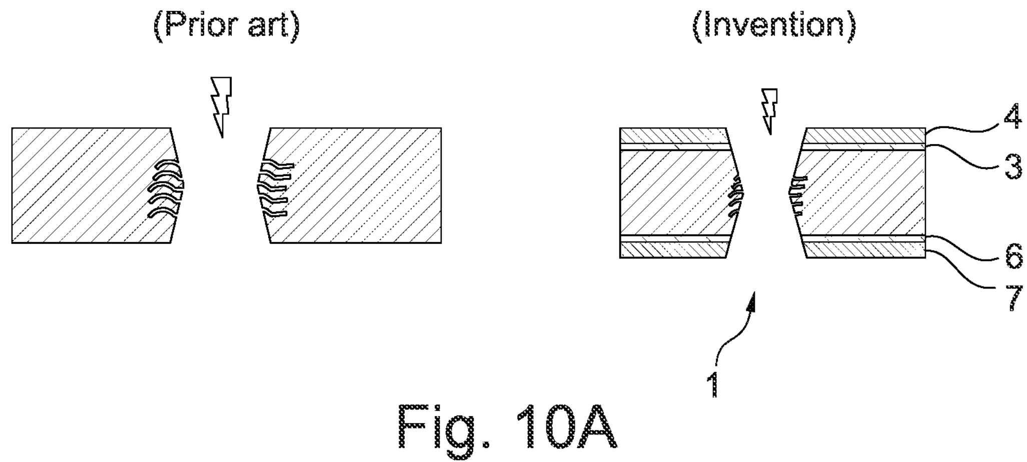
FIG. 10A and FIG. 10B illustrate comparisons between a component carrier of the prior art to a component carrier according to the present disclosure.
Figure 10B:
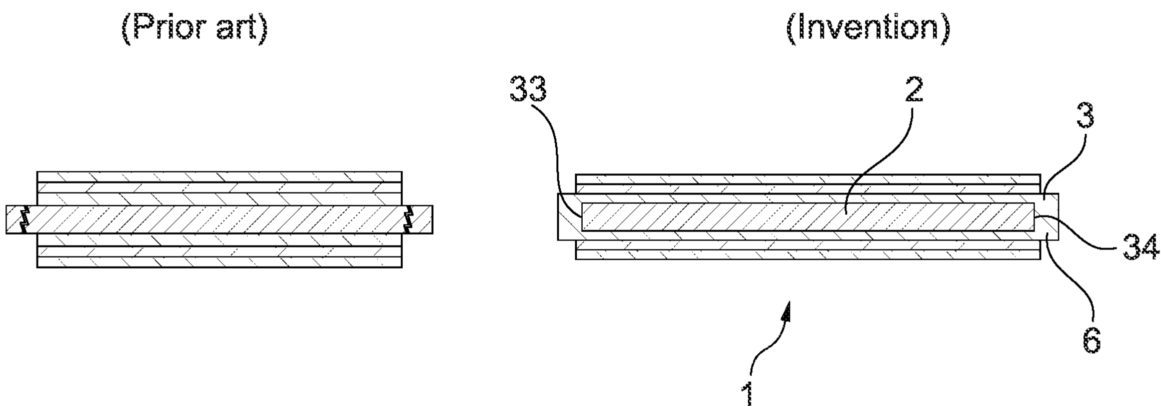

FIGS. 10A and 10B illustrate comparisons between a component carrier of the prior art to a component carrier 1 according to the present invention.

As shown in FIG. 10A, glass cracks can be avoided or reduced in the component carrier 1 of the present invention, for example by the provision of the first electrically insulating layer structure 3 and the first electrically conductive layer structure 4, which can be a first resin coated copper foil (RCC). The effect can be strengthened by providing the second electrically insulating layer structure 6 and the second electrically conductive layer structure 7, which can be a second resin coated copper foil (RCC).

As shown in FIG. 10B, the glass core 2 of the present invention can easier be handled in manufacturing processes because the lateral sides 33, 34 of the glass core 2 of the component carrier 1 are covered and protected by an insulating material, for example by a prepreg material of the first and second electrically insulating layer structures 3, 6 (which can be included in the first and second resin coated copper foils (RCC)). Furthermore, the lateral sides 33, 34 of the glass core 2 of the component carrier 1 can also be strengthened by a copper material of the first and second resin coated copper foils near the lateral sides 33, 34 of the glass core 2.

Figure 11:
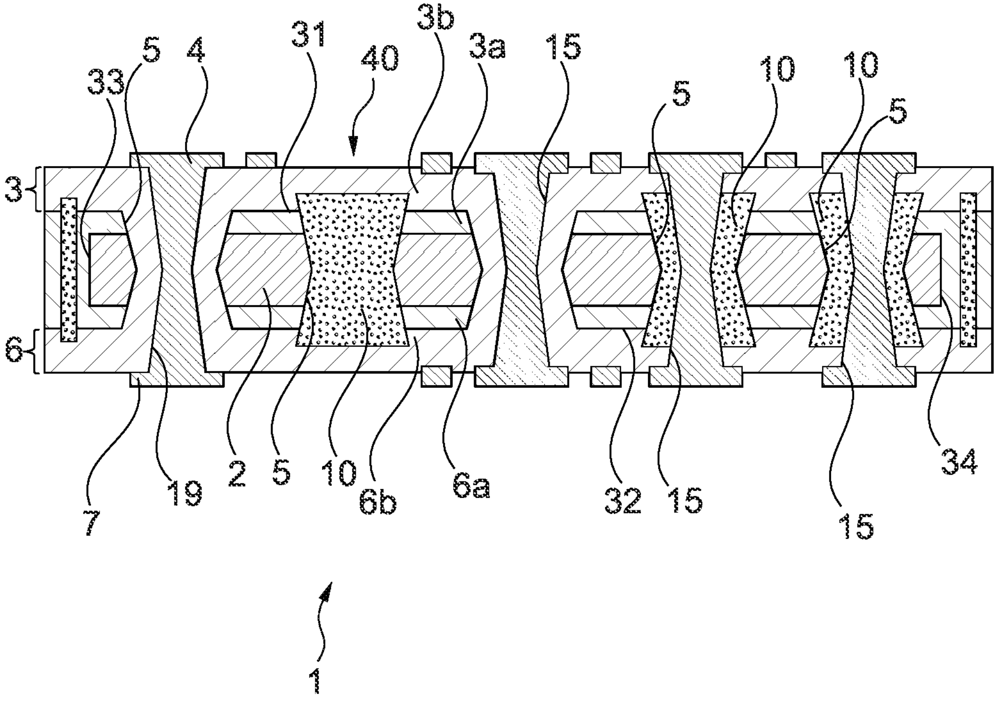
FIG. 11 illustrates a cross-sectional view of a component carrier according to an exemplary embodiment of the disclosure.

FIG. 11 illustrates a cross-sectional view of a component carrier 1 according to an exemplary embodiment of the invention. The embodiment of FIG. 11 is similar to the embodiment of FIG. 3 and is manufactured according to the embodiment of FIG. 4 except for the following differences. The component carrier 1 comprises an insert 40 made of the electrically insulating plugging material or magnetic paste 10. The insert 40 is manufactured by a modified step S28 of FIG. 4 where the outer holes 15 are formed through the first further electrically insulating layer structure 8 corresponding to the inner holes 5 and through the second further electrically insulating layer structure 17 corresponding to the inner holes 5, for example by laser drilling or mechanical drilling, except for that inner hole 5 where the insert 40 is to be formed. At this position, where the insert 40 is to be formed, the electrically insulating plugging material or magnetic paste 10 is kept as it is. Compared with the embodiment of FIG. 3, not every inner hole 5 which is filled with the plugging material 10, must be further drilled and filled with the second further electrically conductive layer structures 9, 18 such as copper. In other words, it is possible that not every hole has a hole-in-hole design. At least one single inner hole 5 filled with magnetic paste 10 enables a subsequent production of e.g., inductors.

The component carrier 1 comprises the glass core 2 as an inorganic layer structure 2 having the first main surface 31 and the second main surface 32, an electrically insulating layer structure formed by a double insulating layer structure, namely a lower insulating layer structure 3*a* applied on the first main surface 31 of the inorganic layer structure 2, and an upper insulating layer structure 3*b* applied on the lower insulating layer structure 3*a*, the first electrically conductive layer 4 structure applied on the double electrically insulating layer structure 3*a*, 3*b* and above the lower insulating layer structure 3*a* and comprising an upper surface, and inner holes 5 extending through the inorganic layer structure 2 and at least partly through the electrically insulating layer structure 3*a*, 3*b*. In this embodiment, the inner holes 5 extend fully through the lower insulating layer structure 3*a* and partly through upper the insulating layer structure 3*b*. In the context of the present invention, the feature "first insulating layer structure" can be implemented by the double insulating layer structure 3*a*, 3*b* as well as by the lower insulating layer structure 3*a* alone.

The inner holes 5 are, along their axes, covered by the plugging material 10, being different from the first electrically conductive layer structure 4, so that the plugging material 10 contacts a lateral side of the inorganic layer structure 2 and a lateral side of the first electrically insulating layer structure 3*a*, 3*b*.

The plugging material 10 does not contact a lateral side of the first electrically conductive layer structure 4 and does not extend up to the upper surface of the first electrically conductive layer structure 4.

At an interface between the inorganic layer structure 2 and the electrically insulating layer structure 3*a*, 3*b*, the inner holes 5 extend straight through the inorganic layer structure 2 and the electrically insulating layer structure 3*a*, 3*b*.

The first electrically conductive layer structure 4 is directly applied on the electrically insulating layer structure 3*a*, 3*b*.

The inner holes 5 comprise a conically-shaped lower inner hole segment, a conically-shaped upper inner hole segment joined to the lower inner hole segment, each of the upper inner hole segment and lower inner hole segment having relatively larger and smaller hole diameter portions, the relatively smaller hole diameter portions of the upper and lower inner hole segments being joined together. Thereby, the inner holes 5 have an hourglass-shape.

Outer holes 15 are formed in the plugging material 10, wherein the outer holes 15 comprise a conically-shaped lower outer hole segment, a conically-shaped upper outer hole segment joined to the lower outer hole segment, each of the upper outer hole segment and lower outer hole segment having relatively larger and smaller diameter portions, the relatively smaller diameter portions of the upper and lower outer hole segments being joined together. Thereby, the outer holes 15 have an hourglass-shape. Each pair of inner and outer holes 5, 15 form a double hourglass-shape or an hourglass-in-hourglass-shape.

An electrically conductive material 4 is filled in the outer holes 15, wherein electrically conductive material 4 is formed by the first electrically conductive layer structure 4.

The electrically insulating layer structure 3*a*, 3*b* is a double-layer structure formed by the lower insulating layer structure 3*a* which is applied on the inorganic layer structure 2, and the upper insulating layer structure 3*b* which is applied on the lower insulating layer structure 3*a* and the inner holes 5, wherein the plugging material 10 is formed by the upper insulating layer structure 3*b*.

The electrically insulating layer structure 3*a*, 3*b* and the first electrically conductive layer structure 4 together can be formed by a first resin coated copper foil.

The component carrier further comprises a second electrically insulating layer structure 6*a*, 6*b* applied on the second main surface 32 of the inorganic layer structure 2, and a second electrically conductive layer structure 7 applied on the second electrically insulating layer structure 6*a*, 6*b*.

The plugging material 10 can be at least one of an electrically insulating plugging material, a magnetic paste, a magnetic paste to implement a coiled copper-structure, an inductive material, or an insert.

A first inner hole 5 and a second inner hole 5 are provided, wherein the first inner hole 5 is, along its axis, covered by a first plugging material 10, and the second inner hole 5 is, along its axis, at least partly covered by a second plugging material 10, wherein the first and second plugging materials can be different from each other. The second plugging material 10 can be an epoxy resin material.

The component carrier comprises outer holes 15 which are formed in the plugging material 10, wherein the outer holes 15 are filled by an electrically conductive material of the first electrically conductive layer structure 4, preferably by copper. The plugging material 10 defines the outer holes 15. The plugging material 10 has a planar surface, preferably a ground surface. The plugging material 10 can protrude from the electrically insulating layer structure 3*a*, 3*b*. The component carrier comprises registration holes which are filled by the same plugging material 10 or another electrically insulating plugging material or magnetic paste.

Figure 12:
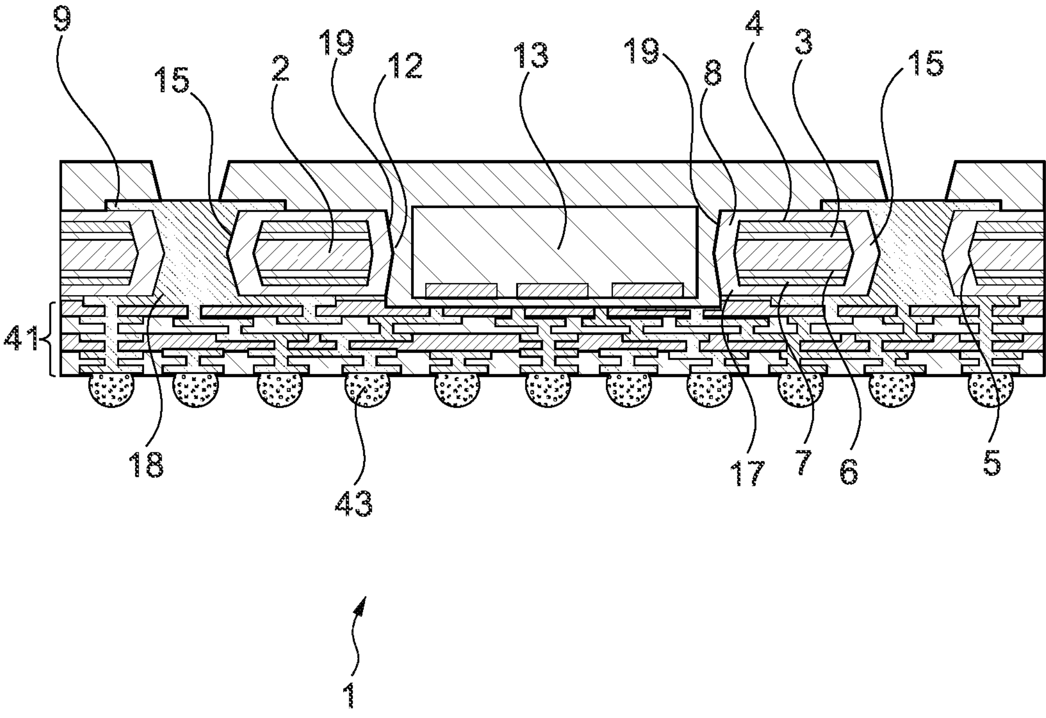
FIG. 12 illustrates a cross-sectional view of a component carrier according to an exemplary embodiment of the disclosure.

FIG. 12 illustrates a cross-sectional view of a component carrier 1 according to an exemplary embodiment of the invention. The embodiment of FIG. 12 is similar to the embodiment of FIG. 5 and is manufactured according to the embodiment of FIG. 6 except for the following differences. Compared with the component carrier 1 of FIG. 5, the component carrier 1 in FIG. 12 does not comprise the support layer 11.

Instead a support layer 11, a temporary carrier (not shown) is connected in a modified step S39 to a stack comprising the glass core 2, the first and second electrically insulating layer structures 3, 6, the first and second electrically conductive layer structures 4, 7, the first and second further electrically insulating layer structures 8, 17 and the first and second further electrically conductive layer structures 9, 18 so that a cavity 12 is formed, wherein a bottom of the cavity 12 is defined by the temporary carrier, and a circumference of the cavity 12 is defined by the component hole 19. A component 13 is arranged on the bottom (i.e., the temporary carrier) within the cavity 12.

Then, the cavity 12 is filled with a resin, and the temporary carrier is removed. Another RCC foil can be applied on the same side. Afterwards, the copper layer of the RCC foil can be patterned, for example by conventional lithography and wet or dry etching methods. The process-steps are repeated until a desired number of layers 41 is achieved. Finally, solder bumps 43 are provided at the bottom side of the component carrier 1.

The component carrier 1 of FIG. 12 is thus manufactured by a modified manufacturing method of FIG. 6 and uses a temporary carrier. The temporary carrier is particularly useful when an asymmetrical build-up stack should be realized.

Figure 13:
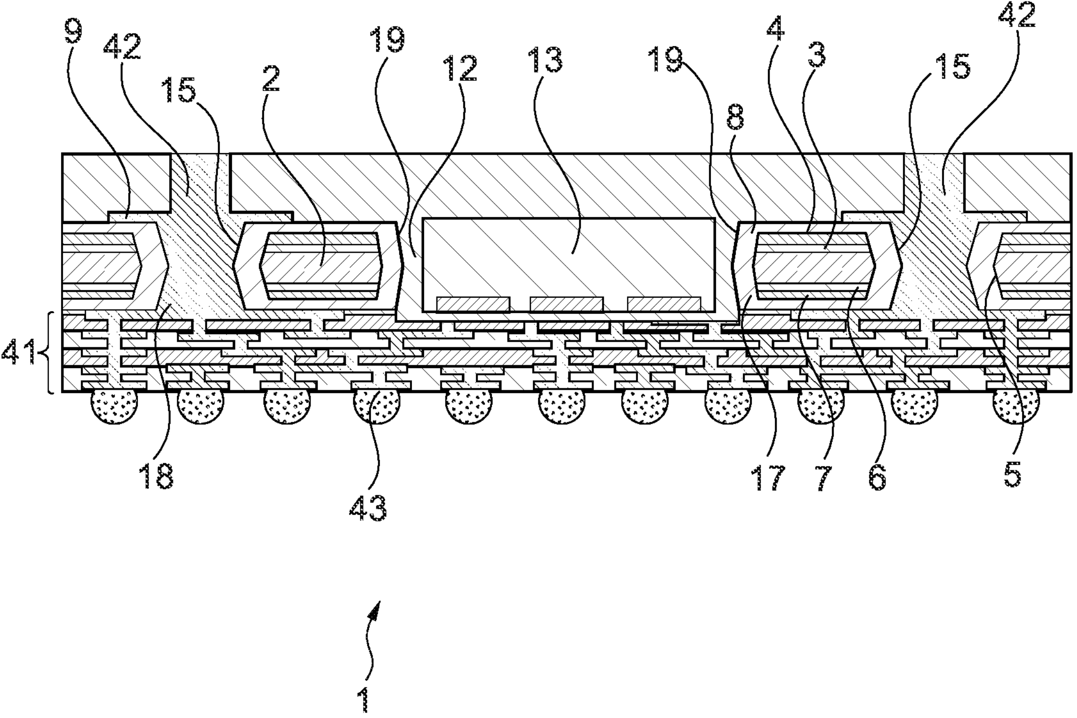
FIG. 13 illustrates a cross-sectional view of a component carrier according to an exemplary embodiment of the disclosure.

FIG. 13 illustrates a cross-sectional view of a component carrier 1 according to an exemplary embodiment of the invention. The component carrier 1 of FIG. 13 is similar to the component carrier 1 of FIG. 12 except for the provision of vias 42 which are provided at a side of the component carrier 1, which is opposed to that side where the solder bumps 43 are provided.

The component carrier 1 of the present invention is particularly suitable as a package substrate for mobile phones and related electronic devices.

In an embodiment, a component carrier 1 comprises: a glass core 2 having a first main surface 31 and a second main surface 32; a first electrically insulating layer structure 3 applied on the first main surface 31 of the glass core 2; a first electrically conductive layer structure 4 applied on the first electrically insulating layer structure 3; and at least one inner hole 5 extending through the glass core 2 and the first electrically insulating layer structure 3.

The at least one inner hole 5 also extends through the first electrically conductive layer structure 4.

The glass core 2 has at least one lateral side 33, 34 connecting the first and second main surfaces 31, 32, wherein the lateral side 33, 34 is at least partly covered by the first electrically insulating layer structure 3.

The first electrically insulating layer structure 3 and the first electrically conductive layer structure 4 together are formed by a first resin coated copper foil.

The component carrier 1 further comprises a second electrically insulating layer structure 6 applied on the second main surface 32 of the glass core 2; and a second electrically conductive layer structure 7 applied on the second electrically insulating layer structure 6.

The component carrier 1 further comprises a first further electrically insulating layer structure 8 applied or laminated on the first electrically conductive layer structure 4 and the at least one inner hole 5.

The component carrier 1 further comprises a first further electrically conductive layer structure 9 applied on the first further electrically insulating layer structure 8.

The at least one inner hole 5 is, along its axis, partly covered by an electrically insulating plugging material or a magnetic paste 10.

The component carrier 1 further comprises a support layer 11 or a temporary carrier; a cavity 12 within the glass core 2, the first electrically insulating layer structure 3 and the first electrically conductive layer structure 4, wherein a bottom of the cavity 12 is defined by the support layer 11 or the temporary carrier; and a component 13 arranged on the bottom within the cavity 12.

The glass core 2 comprises at least two glass panels 2*a*, 2*b* which are connected to each other by an intermediate electrically insulating layer structure 14 therebetween.

The component carrier 1 has a symmetric layer stackup with respect to the glass core 2, wherein the symmetric layer stackup includes a symmetric arrangement of at least one of the first electrically insulating layer structure 3, the first electrically conductive layer structure 4, the at least one inner hole 5, the first further electrically insulating layer structure 8 and the first further electrically conductive layer structure 9.

The component carrier 1 comprises at least one of the following features: the component carrier 1 comprises at least one component 13 being surface mounted on and/or embedded in the component carrier, wherein the at least one component is in particular selected from a group consisting of an electronic component, an electrically non-conductive and/or electrically conductive inlay, a heat transfer unit, a light guiding element, an optical element, a bridge, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip; wherein at least one of the electrically conductive layer structures of the component carrier comprises at least one of the group consisting of copper, aluminum, nickel, silver, gold, palladium, magnesium and tungsten, any of the mentioned materials being optionally coated with supra-conductive material such as graphene; wherein at least one of the electrically insulating layer structure comprises at least one of the group consisting of resin, in particular reinforced or non-reinforced resin, for instance epoxy resin or bismaleimide-triazine resin, FR-4, FR-5, cyanate ester resin, polyphenylene derivate, glass, prepreg material, polyimide, polyamide, liquid crystal polymer, epoxy-based build-up film, polytetrafluoroethylene, a ceramic, and a metal oxide; wherein the component carrier is shaped as a plate; wherein the component carrier is configured as one of the group consisting of a printed circuit board, a substrate, and an interposer; wherein the component carrier is configured as a laminate-type component carrier.

In an embodiment, a method of manufacturing the component carrier 1 comprises steps of providing a glass core 2 having a first main surface 31 and a second main surface 32; applying a first electrically insulating layer structure 3 on the first main surface 31 of the glass core 2; applying a first electrically conductive layer structure 4 on the first electrically insulating layer structure 3; and providing at least one inner hole 5 extending through the glass core 2 and the first electrically insulating layer structure 3 by laser drilling or mechanical drilling or by wet and/or dry etching.

The at least one inner hole 5 is also provided through the first electrically conductive layer structure 4.

The glass core 2 has at least one lateral side 33, 34 connecting the first and second main surfaces 31, 32, wherein the lateral side 33, 34 is at least partly covered by the first electrically insulating layer structure 3.

The first electrically insulating layer structure 3 and the first electrically conductive layer structure 4 together are formed by a first resin coated copper foil.

A second electrically insulating layer structure 6 is applied on the second main surface 32 of the glass core 2 and a second electrically conductive layer structure 7 is applied on the second electrically insulating layer structure 6; or a release layer is applied on the second main surface 32 of the glass core 2 or on another surface of the component carrier.

The method further comprises applying or laminating a first further electrically insulating layer structure 8 on the first electrically conductive layer structure 4 and the at least one inner hole 5; and forming an outer hole 15 through the first further electrically insulating layer structure 8 corresponding to the at least one inner hole 5 by laser drilling or mechanical drilling or by wet and/or dry etching.

The method further comprises applying a first further electrically conductive layer structure 9 on the first further electrically insulating layer structure 8.

The method further comprises covering the at least one inner hole 5, along its axis, partly by an electrically insulating plugging material or a magnetic paste 10.

The method further comprises forming a component hole 19 in the glass core 2, the first electrically insulating layer structure 3 and the first electrically conductive layer structure 4; connecting a support layer 11 or a temporary carrier to a stack comprising the glass core 2, the first electrically insulating layer structure 3 and the first electrically conductive layer structure 4 so that a cavity 12 is formed, wherein a bottom of the cavity 12 is defined by the support layer 11 or the temporary carrier; and arranging a component 13 on the bottom within the cavity 12.

The glass core 2 is formed by at least two glass panels 2*a*, 2*b* which are connected to each other by an intermediate electrically insulating layer structure 14 therebetween.

The component carrier 1 is formed to have a symmetric layer stackup with respect to the glass core 2, wherein the symmetric layer stackup includes a symmetric provision of at least one of the first electrically insulating layer structure 3, the first electrically conductive layer structure 4, the at least one inner hole 5, the first further electrically insulating layer structure 8 and the first further electrically conductive layer structure 9.

The method comprises the following substeps: arranging the glass core 2 in an insulating frame 21; arranging the first resin coated copper foil 3, 4 on the first main surface 31 of the glass core 2 and the insulating frame 21; arranging a second resin coated copper foil 6, 7 on the second main surface 32 of the glass core 2 and the insulating frame 21;

laminating the first and second resin coated copper foils 3, 4; 6, 7 to obtain an intermediate stack 22; and trimming the intermediate stack 22 at its circumference.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which variants use the solutions shown and the principle according to the invention even in the case of fundamentally different embodiments.

| List of reference signs | |
|---|---|
| 1 | component carrier |
| 2 | glass core |
| 2a | glass panel |
| 2b | glass panel |
| 3 | first electrically insulating layer structure |
| 4 | first electrically conductive layer structure |
| 5 | inner hole |
| 6 | second electrically insulating layer structure |
| 6a | insulating layer structure |
| 6b | insulating layer structure |
| 7 | second electrically conductive layer structure |
| 8 | first further electrically insulating layer structure |
| 9 | first further electrically conductive layer structure |
| 10 | electrically insulating plugging material, magnetic paste |
| 11 | support layer |
| 12 | cavity |
| 13 | component |
| 14 | intermediate electrically insulating layer structure |
| 15 | outer hole |
| 16 | registration hole |
| 17 | second further electrically insulating layer structure |
| 18 | second further electrically conductive layer structure |
| 19 | component hole |
| 21 | frame |
| 22 | intermediate stack |
| 31 | first main surface |
| 32 | second main surface |
| 33 | lateral side |
| 34 | lateral side |
| 40 | insert |
| 41 | layer |
| 42 | via |
| 43 | solder bumps |

The invention claimed is:

1. A component carrier, comprising:

an inorganic layer structure having a first main surface and a second main surface; a first electrically insulating layer structure applied on the first main surface of the inorganic layer structure;

a first electrically conductive layer structure applied on or above the first electrically insulating layer structure; and at least one inner hole extending through the inorganic layer structure and through the first electrically insulating layer structure;

wherein the at least one inner hole is, along its axis, at least partly covered by an electrically insulating plugging material such that the plugging material contacts a lateral side of the inorganic layer structure, a lateral side of the first electrically insulating layer structure, and a lateral side of the first electrically conductive layer structure;

wherein the plugging material is configured to define a hollow space containing a conductive material and/or a component.

2. The component carrier according to claim 1, wherein the plugging material does not contact a lateral side of the first electrically conductive layer structure and/or does not extend up to an upper surface of the first electrically conductive layer structure.

3. The component carrier according to claim 1, wherein at an interface between the inorganic layer structure and the first electrically insulating layer structure, the at least one inner hole extends straight through the inorganic layer structure and the first electrically insulating layer structure.

4. The component carrier according to claim 1, wherein the first electrically conductive layer structure is directly applied on the first electrically insulating layer structure.

5. The component carrier according to claim 1, wherein the at least one inner hole comprises a conically-shaped lower inner hole segment, a conically-shaped upper inner hole segment joined to the lower inner hole segment, each of the upper inner hole segment and lower inner hole segment having relatively larger and smaller hole diameter portions, the relatively smaller hole diameter portions of the upper and lower inner hole segments being joined together.

6. The component carrier according to claim 1, wherein an outer hole is formed in the plugging material, wherein the outer hole comprises a conically-shaped lower outer hole segment, a conically-shaped upper outer hole segment joined to the lower outer hole segment, each of the upper outer hole segment and lower outer hole segment having relatively larger and smaller diameter portions, the relatively smaller diameter portions of the upper and lower outer hole segments being joined together.

7. The component carrier according to claim 6, wherein an electrically conductive material is filled in the outer hole.

8. The component carrier according to claim 1, wherein the at least one inner hole also extends through the first electrically conductive layer structure.

9. The component carrier according to claim 1, wherein the first electrically insulating layer structure forms or is part of a double-layer structure comprising a lower insulating layer structure which is applied on the inorganic layer structure and an upper insulating layer structure which is applied on the lower insulating layer structure and the at least one inner hole, wherein the plugging material is formed by material of the upper insulating layer structure.

10. The component carrier according to claim 1, wherein the first electrically insulating layer structure and the first electrically conductive layer structure together are formed by a first resin coated copper foil.

11. The component carrier according to claim 1, further comprising:

a second electrically insulating layer structure applied on the second main surface of the inorganic layer structure; and a second electrically conductive layer structure applied on the second electrically insulating layer structure.

12. The component carrier according to claim 1, further comprising:

a first further electrically insulating layer structure applied or laminated on the first electrically conductive layer structure and the at least one inner hole, wherein the first further electrically insulating layer structure forms the plugging material.

13. The component carrier according to claim 12, further comprising:

a first further electrically conductive layer structure applied on the first further electrically insulating layer structure.

14. The component carrier according to claim 1, wherein the plugging material is an insert.

15. The component carrier according to claim 1, wherein a first inner hole and a second inner hole are provided, wherein the first inner hole is, along its axis, at least partly covered by a first plugging material, and the second inner hole is, along its axis, at least partly covered by a second plugging material, wherein the first and second plugging materials are different from each other.

16. The component carrier according to claim 15, wherein the second plugging material is an epoxy resin material.

17. The component carrier according to claim 1, comprising at least one of the following:

an outer hole formed in the plugging material, wherein the outer hole is filled by an electrically conductive material;

the plugging material defines an outer hole;

the plugging material has a planar surface;

the plugging material protrudes from the first electrically insulating layer structure;

the component carrier comprises registration holes which are filled by the same plugging material or another electrically insulating plugging material or magnetic paste.

18. The component carrier according to claim 1, further comprising:

a support layer or a temporary carrier;

a cavity within the inorganic layer structure, the first electrically insulating layer structure and the first electrically conductive layer structure, wherein a bottom of the cavity is defined by the support layer or the temporary carrier; and a component arranged on the bottom within the cavity.

19. The component carrier according to claim 1, wherein the inorganic layer structure is a glass core and/or comprises at least two glass panels which are connected to each other by an intermediate electrically insulating layer structure therebetween.

20. The component carrier according to claim 1, wherein the component carrier has a symmetric layer stackup with respect to the inorganic layer structure, wherein the symmetric layer stackup includes a symmetric arrangement of at least one of the first electrically insulating layer structure, the first electrically conductive layer structure, the at least one inner hole, the first further electrically insulating layer structure and the first further electrically conductive layer structure.

21. The component carrier according to claim 1, further comprising at least one of the following features:

the component carrier comprises at least one component surface mounted on and/or embedded in the component carrier, wherein the at least one component is selected from a group consisting of an electronic component, an electrically non-conductive and/or electrically conductive inlay, a heat transfer unit, a light guiding element, an optical element, a bridge, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip;

wherein at least one of the electrically conductive layer structures of the component carrier comprises at least one of the group consisting of copper, aluminum, nickel, silver, gold, palladium, magnesium and tungsten;

wherein at least one of the electrically insulating layer structure comprises at least one of the group consisting of reinforced or non-reinforced resin, epoxy resin or bismaleimide-triazine resin, FR-4, FR-5, cyanate ester resin, polyphenylene derivate, glass, prepreg material, polyimide, polyamide, liquid crystal polymer, epoxy-based build-up film, polytetrafluoroethylene, a ceramic, and a metal oxide;

wherein the component carrier is shaped as a plate;

wherein the component carrier is configured as one of the group consisting of a printed circuit board, a substrate, and an interposer;

wherein the component carrier is configured as a laminate-type component carrier.

22. A method, comprising:

providing an inorganic layer structure having a first main surface and a second main surface;

applying a first electrically insulating layer structure on the first main surface of the inorganic layer structure;

applying a first electrically conductive layer structure on or above the first electrically insulating layer structure; and providing at least one inner hole extending through the inorganic layer structure and the first electrically insulating layer structure;

wherein the at least one inner hole is, along its axis, at least partly covered by an electrically insulating plugging material, such that the plugging material contacts a lateral side of the inorganic layer structure, a lateral side of the first electrically insulating layer structure, and a lateral side of the first electrically conductive layer structure;

wherein the plugging material is configured to define a hollow space containing a conductive material and/or a component.

23. The method according to claim 22, wherein a second electrically insulating layer structure is applied on the second main surface of the inorganic layer structure and a second electrically conductive layer structure is applied on the second electrically insulating layer structure; or a release layer is applied on the second main surface of the inorganic layer structure or on another surface of the component carrier.

24. The method according to claim 22, further comprising:

applying or laminating a first further electrically insulating layer structure on the first electrically conductive layer structure and the at least one inner hole; and forming an outer hole through the first further electrically insulating layer structure corresponding to the at least one inner hole by laser drilling or mechanical drilling or by wet and/or dry etching.

25. The method according to claim 22, further comprising:

forming a component hole in the inorganic layer structure, the first electrically insulating layer structure and the first electrically conductive layer structure;

connecting a support layer or a temporary carrier to a stack comprising the inorganic layer structure, the first electrically insulating layer structure and the first electrically conductive layer structure so that a cavity is formed, wherein a bottom of the cavity is defined by the support layer or the temporary carrier; and arranging a component on the bottom within the cavity.

26. The method according to claim 22, wherein the component carrier is formed to have a symmetric layer stackup with respect to the inorganic layer structure, wherein the symmetric layer stackup includes a symmetric provision of at least one of the first electrically insulating layer structure, the first electrically conductive layer structure, the at least one inner hole, the first further electrically insulating layer structure and the first further electrically conductive layer structure.

27. The method according to claim 22, comprising the following substeps:

arranging the inorganic layer structure in an insulating frame;

arranging the first resin coated copper foil on the first main surface of the inorganic layer structure and the insulating frame;

arranging a second resin coated copper foil on the second main surface of the inorganic layer structure and the insulating frame;

laminating the first and second resin coated copper foils to obtain an intermediate stack; and trimming the intermediate stack at its circumference.

28. The method according to claim 22, wherein the step of providing the at least one inner hole is performed by laser drilling or mechanical drilling or by wet and/or dry etching.

* * * * *